(12) United States Patent
Araci et al.

(10) Patent No.: US 8,492,737 B2
(45) Date of Patent: Jul. 23, 2013

(54) TUNABLE INFRARED EMITTER

(75) Inventors: Ismail Emre Araci, Palo Alto, CA (US);
Veysi Demir, Tucson, AZ (US);
Aleksandr V. Kropachev, Tucson, AZ (US)

(73) Assignees: The Arizona Board of Regents on behalf of The University of Arizona, Tuscon, AZ (US); Intex, Inc., Tuscon, AZ (US)

( * ) Notice: Subject to any disclaimer, the term of this patent is extended or adjusted under 35 U.S.C. 154(b) by 0 days.

(21) Appl. No.: 13/299,492

(22) Filed: Nov. 18, 2011

(65) Prior Publication Data

US 2012/0235067 A1    Sep. 20, 2012

Related U.S. Application Data

(60) Provisional application No. 61/458,159, filed on Nov. 18, 2010, provisional application No. 61/516,851, filed on Apr. 8, 2011.

(51) Int. Cl.
| | | |
|---|---|---|
| *H01L 51/50* | (2006.01) | |
| *H01L 33/00* | (2010.01) | |
| *B01J 19/12* | (2006.01) | |

(52) U.S. Cl.
USPC ............ 250/504 R; 250/503.1; 250/493.1; 250/495.1; 219/411; 219/553; 392/408

(58) Field of Classification Search
USPC ...... 250/504 R, 503.1, 493.1, 495.1; 392/408; 219/411, 553
See application file for complete search history.

(56) References Cited

U.S. PATENT DOCUMENTS

| | | | |
|---|---|---|---|
| 4,754,141 A * | 6/1988 | Mindock | 250/343 |
| 7,498,574 B2 | 3/2009 | Puscasu et al. | |
| 8,076,617 B2 * | 12/2011 | Norwood et al. | 219/407 |
| 8,106,199 B2 * | 1/2012 | Jabbour et al. | 546/10 |
| 2007/0096087 A1 | 5/2007 | Catrysse et al. | |

(Continued)

FOREIGN PATENT DOCUMENTS

| | | |
|---|---|---|
| WO | WO 2007/053624 | 5/2007 |
| WO | WO 2009/009181 | 1/2009 |
| WO | WO 2010/050637 | 5/2010 |
| WO | WO 2010/078014 | 7/2010 |

OTHER PUBLICATIONS

Abbas et al. (2010) "Plasmon-Polariton Band Structures of Asymmetric T-Shaped Plasmonic Gratings," *Opt. Express* 18(3):2509-2514.

(Continued)

*Primary Examiner* — Nikita Wells
(74) *Attorney, Agent, or Firm* — Lathrop & Gage LLP

(57) ABSTRACT

Provided are methods of tuning the emission wavelength from a tunable infrared plasmonic emitting structure, which structure comprises: (a) a perforated or patterned first conductive layer having a plurality of relief features provided in a periodic spatial configuration, wherein the relief features are separated from each other by adjacent recessed features, wherein the distance between features is between 1-15 μm; (b) a dielectric layer underlying the first conductive layer; (c) a second conductive layer underlying the dielectric film; and (d) a substrate underlying the second conductive layer; wherein the emission wavelength is tuned by applying a force in a biaxial direction parallel to the substrate, changing the distance between relief features, or changing the resistivity and dielectric constant of the dielectric layer.

22 Claims, 15 Drawing Sheets

U.S. PATENT DOCUMENTS

| | | | |
|---|---|---|---|
| 2007/0165295 A1 | 7/2007 | Kim et al. |
| 2007/0269178 A1 | 11/2007 | Sarukura et al. |
| 2007/0297750 A1 | 12/2007 | Bass et al. |
| 2010/0213492 A1 | 8/2010 | Lee et al. |
| 2010/0261263 A1 | 10/2010 | Vo-Dinh et al. |
| 2010/0303414 A1 | 12/2010 | Atwater et al. |
| 2011/0042589 A1 | 2/2011 | Norwood et al. |
| 2011/0188525 A1 | 8/2011 | Claudon et al. |

OTHER PUBLICATIONS

Almasri et al. (2001) "Self Supporting Uncooled Infrared Microbolometers with Low-Thermal Mass," *J. Microelectromech. Syst.* 10(3):469-476.

Araci et al. (2010) "Mechanical and thermal stability of plasmonic emitters on flexible polyimide substrates," *Appl. Phys. Lett.* 97:041102.

Beck et al. (1998) "Mechanical properties of $SiO_2$ and $Si_3N_4$ coatings: a BAM/NIST co-operative project," *Thin Solid Films* 332:164-171.

Chang et al. (2009) "Emission Properties of Ag/dieelctric/Ag Plasmonic Thermal Emitter with Different Lattice Type, Hole Shape, and Dielectric Material," *Appl. Phys. Lett.* 95(21):213102.

Cordill et al. (Apr. 2010) "Fracture and Delamination of Chromium Thin Films on Polymer Substrates," *Metallurgical and Materials Transactions a—Physical Metallurgy and Materials Science* 41A(4):870.

Demir et al. (Jan. 10, 2011) "Nanoamorphous Carbon as a Blackbody Source in Plasmonic Thermal Emitters," *Appl. Optics* 50(2):218-221.

Dmitriev et al. (2001) "Thermostable resistors based on diamond-like carbon films deposited by CVD method," *Diamond and Related Materials* 10:1007.

El-Kady et al. (2003) "Tunable narrow-band infrared emitters from Hexagonal lattices," *Photonics Nanostruct, Fundam. Appl.* 1:69.

Electro Optical Components, Inc., http://www.eoc-inc.com/infrared__ir__pulsable__sources.htm Downloaded (2011).

Hsu et al. (2007) "Silver particle carbon-matrix composites as thick films for electrical applications," *J. Electronic Mater.* 36(9):1188.

http://www.minco.com/uploadedFiles/Products/Thermofoil__Heaters/All-Polymide/hs202h-hap.pdf.

http://www2.dupont.com/Kapton/en__US/assets/downloads/pdf/summaryofprop.pdf.

Huang et al. (2000) "Conduction mechanism in molybdenum-containing diamond-like carbon deposited using electron cyclotron resonance chemical vapor deposition," *J. Appl. Phys.* 88:7.

Huang et al. (2002) "Dielectric properties of molybdenum-containing diamond-like carbon films deposited using electron resonance chemical vapor deposition," *Thin Solid Films* 409:211-219.

Kim et al. (May 14, 2001) "Strain-Tunable Photonic Band Gap Crystals," *Appl. Phys. Lett.* 78(20):3015.

Kim et al. (2008) "Strain induced tunable wavelength filters based on flexible polymer waveguide Bragg reflector," *Opt. Express* 16(3):1423.

Lai et al. (1995) "High-Speed ($10^{4\circ}$C/s) Scanning Microcalorimetry with Monolayer Sensitivity ($J/m^2$)," *Appl. Phys. Lett.* 67(9):1229-.

Leterrier et al. (Mar. 2010) "Mechanical Failure Analysis of Thin Film Transistor Devices on Steel and Polyimide Substrates for Flexible Display applications," *Engineering Fracture Mechanics* 77(4):660-670.

Lin (2005) "Long-Range Ordered Nanoaperture Array with Uniform Diameter and Interpore Spacing," *Appl. Phys. Lett.* 87:173116.

Lu et al. (2009) "Failure by Simultaneous Grain Growth, Strain Localization, and Interface Debonding in Metal Films on Polymer Substrates," *J. Mater. Res.* 24(2):379-385.

Lu et al. (Mar. 2010) "The Effect of Film Thickness on the Failure Strain of Polymer-Supported Metal Films," *Acta Materialia* 58(5):1679-1687.

Matsui et al. (Mar. 29, 2007) "Transmission Resonances Through Aperiodic Arrays of Subwavelength Apertures," *Nature* 446:517-521.

Moseler et al. (2005) "The ultrasmoothness of diamond-like carbon surfaces," *Science* 309:1545.

Norwood et al. (2006) "New organic infiltrants of 2-D and 3-D photonic crystals," *Proc. SPIE*, ISSN 0277-768.

Norwood, R.A. "Plasmonic Infrared Emitters Based on Nanoamorphous Carbon," http://www.optics.arizona.edu/ranorwood/plasmonic-infrared-emitters.html, Retrieved Nov. 8, 2011.

Ordal et al. (1983) "Optical properties of the metals Al, Co, Cu, Au, Fe, Pb, Ni, Pd, Pt, Ag, Ti, and W in infrared and far infrared," *Appl. Opt.* 22:1099.

Park et al. (2004) "Tunable nanophotonic devices based on flexible photonic crystal," *Proc. SPIE* 5511:165.

Park et al. (2005) "Transparent Flexible Substrates Based on Polyimides With Aluminum Doped Zinc Oxide (AZO) Thin Films," *Proc. IEEE* 93(8):1447.

Pecht et al. (1995) "To cut or not to cut: A thermomechanical stress analysis of polyimide thin-film on ceramic structures," Ieee Transactions on Components Packaging and Manufacturing Technology Part B 18(1):150.

Pralle et al. (2002) "Photonic Crystal Enhanced Narrow-Band Infrared Emitters," *Appl. Phys. Lett.* 81(25):4685.

Tay et al. (2009) "Plasmonic thermal IR emitters based on nanoamorphous carbon," *Appl. Phys. Lett.* 94(7):071113.

The Photonics Science and Technology Group, "Plasmonic Infrared Emitters Based on Nanoamorphous Carbon," http://optsc-cianerc.carnet.arizona.edu/pstg/rp6.html, Retrieved Oct. 26, 2012.

Tsai et al. (2006) "High Performance Midinfrared Narrow-Band Plasmonic Thermal Emitter," *App. Phys. Lett.* 89(17):173116.

Vasiliev et al. (2008) "Alumina MEMS platform for impulse semiconductor and IR optic gas sensors," *Sensors and Actuators B: Chemical* 132(1):216.

Wang et al. (2007) "Reflection and Emission Properties of an Infrared Emitter," *Optics Express* 15(22):14673-14678.

Wang et al. (2009) "T-Shaped Plasmonic Array as a Narrow-Band Thermal Emitter or Biosensor," *Opt. Express* 17(16):13526-13531.

Wei et al. (1999) "Preparation and mechanical properties of composite diamond-like carbon thin films," *J. Vac. Sci. Technol. A* 17(6):3406-3414.

Williams (2008) "Highly Confined Guiding of Terahertz Surface Plasmon Polaritons on Structured Metal Surfaces," *Nature Photonics* 2:175-179.

Ye et al. (2008) "Coupling of Surface Plasmnos between two Silver Films in a $Ag/SiO_2/Ag$ Plasmonic Thermal Emitter with Grating Structure," *Applied Physics Letters* 93(26):263106.

Zakhidov et al. (1998) "Carbon Structures with Three-Dimensional Periodicity at Optical Wavelengths," *Science* 282:897.

Zoo et al. (Aug. 14, 2001) "Investigation of Coefficient of Thermal Expansion of Silver Thin Film on Different Substrates Using X-Ray Diffraction," *Thin Solid Films* 513(1-2):170-174.

* cited by examiner

TUNABLE INFRARED EMITTER

CROSS-REFERENCE TO RELATED APPLICATIONS

This application claims priority to U.S. provisional application Ser. No. 61/458,159, filed Nov. 18, 2010 and U.S. provisional application Ser. No. 61/516,851, filed Apr. 8, 2011, which are hereby incorporated by reference in their entirety.

STATEMENT REGARDING FEDERAL RESEARCH SUPPORT

[Not Applicable]

BACKGROUND OF THE INVENTION

The mid-infrared spectral range (generally from 3 to 15 µm) is of critical importance for thermal imaging, sensing and spectroscopy of chemical and biological agents, and environmental monitoring. For example, several gas molecules such as $CO_2$, $N_2O$ and CO have strong absorption bands in the mid-wavelength infrared (e.g., 3-8 µm). Detection of these gas molecules is important for environmental monitoring, safety, automotive applications and homeland security.

However, very few radiation sources exist in the infrared spectral range that have sufficient power or structural stability to be useful. Also, current sources do not allow for real-time spectral tuning.

There is a need in the art for a tunable infrared emitter.

SUMMARY OF THE INVENTION

Provided are tunable infrared emitters and methods for using tunable infrared emitters. In some embodiments, the devices and methods described here allow for reversibly tuning the emission wavelength. The devices and methods described here allow for tuning the emission wavelength in real-time using a single emitter, in some embodiments. This allows for cost and efficiency advantages over devices that do not allow for tunability in one device.

In an embodiment, provided is a tunable infrared plasmonic emitting structure comprising: (a) a perforated or patterned first conductive layer having a plurality of relief features provided in a periodic spatial configuration, wherein the relief features are separated from each other by adjacent recessed features; (b) a dielectric layer underlying the first conductive layer; (c) a second conductive layer underlying the dielectric film; and (d) a flexible substrate underlying the second conductive layer. In an embodiment, the distance between the relief features is from 1-15 micrometers. In an embodiment, the flexible substrate is a high temperature stable polymer. In an embodiment, the high temperature stable polymer is polyimide. As used herein, "high temperature stable polymer" is a polymer or copolymer that does not undergo chemical or physical destruction at temperatures used in the structure. In an embodiment, a high temperature stable polymer is stable up to 400° C. In an embodiment, a high temperature stable polymer is stable up to 300° C. In an embodiment, the flexible substrate is polydimethylsiloxane (PDMS). PDMS is stable at temperatures above 200° C.

In another embodiment, provided is a tunable infrared plasmonic radiation emitting structure comprising: (a) a perforated or patterned first conductive layer having a plurality of relief features provided in a periodic spatial configuration, wherein the relief features are separated from each other by adjacent recessed features, wherein the relief features are spaced between 1-15 µm apart; (b) a dielectric layer comprising nanoamorphous carbon underlying the first conductive layer; (c) a second conductive layer underlying the dielectric film; and (d) a substrate underlying the second conductive layer.

Also provided is a method of tuning the emission wavelength from a tunable infrared plasmonic emitting structure, comprising: providing a structure comprising: (a) a perforated or patterned first conductive layer having a plurality of relief features provided in a periodic spatial configuration, wherein the relief features are separated from each other by adjacent recessed features, wherein the distance between features is between 1-15 µm; (b) a dielectric layer underlying the first conductive layer; (c) a second conductive layer underlying the dielectric film; and (d) a substrate underlying the second conductive layer; tuning the emission wavelength by one or more of applying a force in a biaxial direction parallel to the substrate, changing the distance between relief features, or changing the resistivity and dielectric constant of the dielectric layer. In embodiments, the resistivity and dielectric constant of the dielectric layer are chosen by appropriate selection of the materials used so that the resistivity of the dielectric layer is between $10^9$ to $10^6$ Ω·cm. Other values of resistivity and dielectric constant are incorporated in the disclosure, as will be apparent to one of ordinary skill in the art.

Also provided in an embodiment is a method of reversibly tuning the light emission from a tunable radiation emitting structure described herein, comprising increasing or decreasing the distance between the relief features by applying a mechanical force in the plane of the flexible substrate. In an embodiment, the wavelength of emission can be tuned by applying a permanent or non-permanent force along the plane of the substrate. In an embodiment, the wavelength of emission can be reversibly tuned by applying a non-permanent force along the plane of the substrate. In an embodiment, a 2D mechanical force is applied in a biaxial direction along the plane of the substrate. In an embodiment, the force is applied in symmetric biaxial directions. In an embodiment, the mechanical force increases the distance between relief features by 1-25%, and all intermediate values and ranges.

Also provided is a method of light emission comprising applying electrical energy to a structure described herein. In an aspect, the electrical energy heats the structure.

In an embodiment, the first and second conductive layers of the structures described herein are independently one or more of aluminum, silver, gold, nanoamorphous carbon doped with metal, platinum, copper, iron, iridium, tungsten, molybdenum, nickel, cobalt, zinc, lead, vanadium, chromium, titanium, conducting carbides, silicides or nitrides. As known in the art, more than one metal can be alloyed together. Such metal alloys may be used in the embodiments described here. In an embodiment, the first and second conductive layers are independently silver or gold. In an embodiment, the first conductive layer is not nanoamorphous carbon doped with titanium nitride. In an embodiment, the substrate is silicon or glass.

In an embodiment, the dielectric layer comprises a dielectric material selected from one or more of silicon dioxide, silicon nitride, silicon oxynitride, aluminum oxide, aluminum nitride, polymer, $Ta_2O_5$, or nanoamorphous carbon. Other dielectric materials are known in the art and may be used here. In an embodiment, the dielectric layer comprises: $SiO_2$, $Al_2O_3$, $Ta_2O_5$, or nanoamorphous carbon. In an embodiment, the dielectric layer is $SiO_2$, $Al_2O_3$ or nanoamorphous carbon. In an embodiment, the dielectric layer comprises nanoamorphous carbon and a total of from 0 to 60 atomic percent of one or more dopants of the dopant group consisting of: transition metals, lanthanoids, conductive carbides, silicides and nitrides. In an embodiment, the nanoamorphous carbon layer includes a $MoSi_2$ dopant.

The conductivity levels of the structures and components of the structures described herein can be altered, depending on the desired function. For example, examples described further herein describe changing the conductivity of a NAC layer doped with $MoSi_2$. As nonlimiting examples, the resistivity of the NAC layer can range from $10^9$ to $10^7$ Ω·cm. Conductivity values other than those specifically described herein are intended to be included to the extent as if they were specifically exemplified.

The thickness of each layer is independently chosen and is generally the thickness that provides the desired effects, as further described herein. In an embodiment, the thickness of the first and second conductive layer is independently 500 nm or less. In an embodiment, the thickness of the first and second conductive layer is independently 300 nm or less. In an embodiment, the thickness of the first and second conductive layer is independently 100 nm or less. In an embodiment, the thickness of the dielectric layer is 600 nm or less. In an embodiment, the thickness of the dielectric layer is 500 nm or less. In an embodiment, the thickness of the dielectric layer is 300 nm or less. In an embodiment, when polyimide is used, the polyimide layer is between 200 and 1000 microns. In an embodiment, the thickness of the polyimide layer is between 300 and 750 microns. In an embodiment, the thickness of the polyimide layer is 500 microns. In an embodiment, the thickness of the polyimide layer is between 1 micron and 500 microns. In an embodiment, the thickness of the polyimide layer is between 2 microns and 100 microns.

Provided are plasmonic emitters which have discontinuous periodic or quasi-periodic features. In one embodiment, the emitters emit infrared radiation. In one embodiment, the emitters emit radiation when heated. In one embodiment, the emitters emit radiation through coupled surface plasmons. The structures can be heated using any suitable means, such as application of electric field (Ohm heating) or radiative heating. Both the central wavelength of emission and bandwidth of emission can be tuned by one or more of appropriate selection of (A) the distance between features and selection of the materials used; (B) the resistivity and dielectric constant of the dielectric layer; as well as by (C) applying a force to the structure. These parameters and their selection are further described below.

More specifically, provided is a tunable radiation emitting structure where a portion of the structure has periodic or quasi-periodic features, wherein the structure emits narrowband infrared radiation spectral range when heated. In an embodiment, the center wavelength of emission is selected by changing the distance between features. In an embodiment, the center wavelength of emission is in the infrared wavelength range. In an embodiment, the frequency of emission is between 1 to 400 THz. In an embodiment, the center wavelength of emission is between 0.7 μm and 1,000 μm. In an embodiment, the center wavelength of emission is between 1 μm to 100 μm. In an embodiment, the center wavelength of emission is between 2 μm to 25 μm. In an embodiment, the light emission is in the range of 1-25 μm. All individual values and ranges of emission wavelengths and frequencies in the infrared wavelength and frequency ranges are intended to be included here, to the extent as if listed separately, for any purpose, including to exclude or include values or ranges in a claim.

The average distance between features is such that infrared radiation is emitted from the structure under appropriate conditions for emission. In one embodiment, the average distance between features is from 1 μm to 100 μm. In one embodiment, the average distance between features is between 1 μm to 25 μm. In one embodiment, the average distance between features is between 1 μm to 10 μm. In one embodiment, the average distance between features is between 0.5 μm to 25 μm. As further described below, the emitted wavelength generally scales with the average distance between features, therefore, the desired emitted wavelength will affect the design distance between features. In one embodiment, the features form a photonic crystal structure. The preparation of photonic crystal structures is generally known in the art. All individual values and ranges of distance between features are intended to be included here, to the extent as if they were individually listed, for any purpose, including to exclude or include values or ranges in a claim.

Also provided is a method of narrowband infrared light emission, comprising: applying electrical energy to a structure described herein. The electrical energy takes any suitable form. In an embodiment, the electrical energy heats the structure. In an embodiment, the electrical energy is supplied by application of electric current. In one embodiment, the structure is heated to above 100° C. In an embodiment, the structure is heated to above 200° C. In one embodiment, the structure is heated to above 250° C. In an embodiment, the structure is heated to above 300° C. In an embodiment, the structure is heated to below the melting point of the structure. All temperature values and intermediate temperature ranges up to the melting point of the structure are intended to be included here to the extent as if they were individually listed, for any purpose, including to exclude or include values or ranges in a claim. In general, the intensity of emitted radiation increases with increasing temperature.

BRIEF DESCRIPTION OF THE FIGURES

FIG. 5A shows a strain-free view. FIG. 5B shows a stretched film due to axial strain.

DETAILED DESCRIPTION OF THE INVENTION

Figure 1:
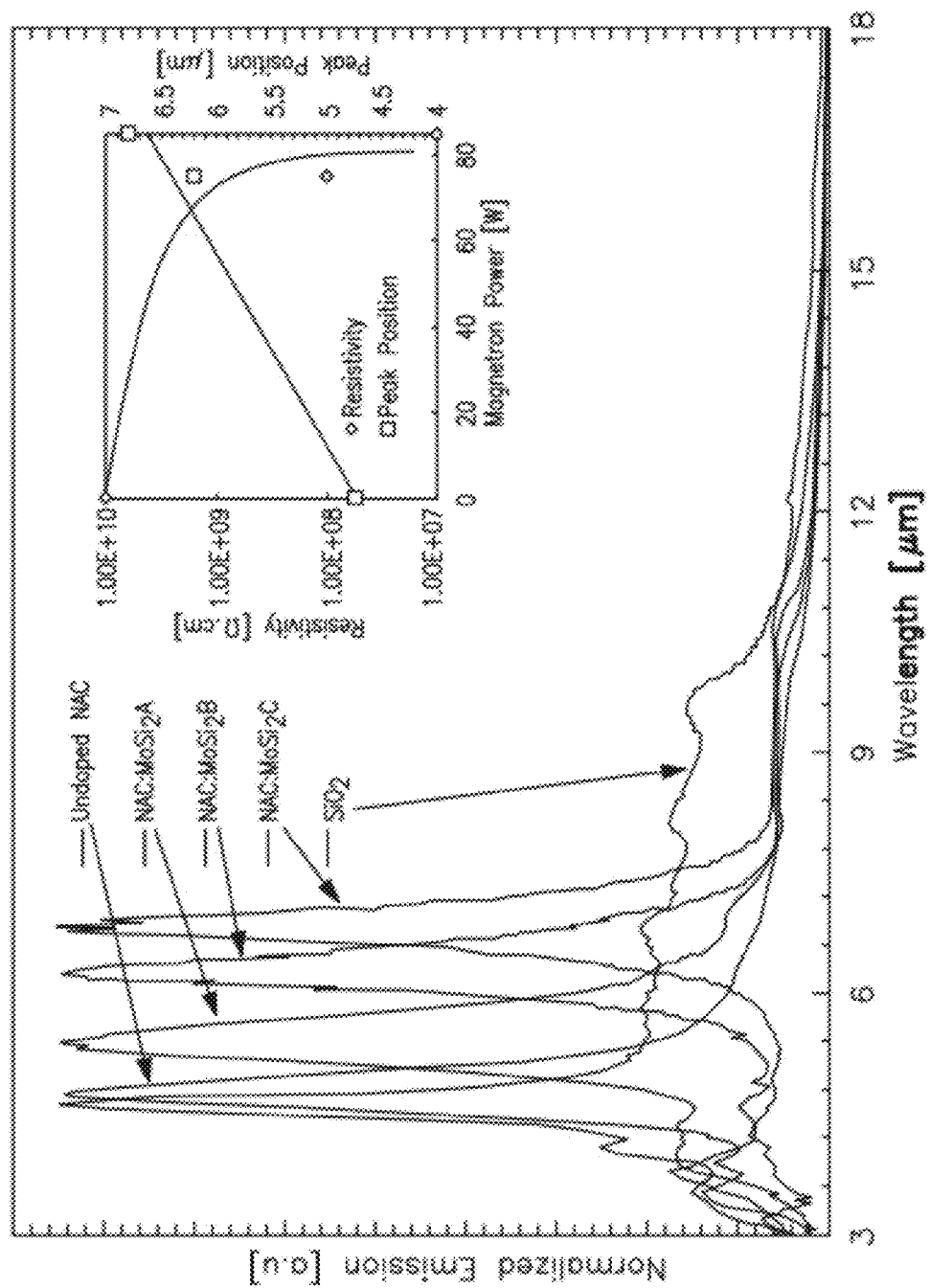
FIG. 1 shows the normalized emission spectrum of PTEs of Ag/NAC/Ag, Ag/NAC:$MoSi_2$/Ag and Ag/$SiO_2$/Ag with periodicity of a=4 μm and diameter d=2 μm at 220° C. Each layer is 100 nm thick.

The term "electromagnetic radiation", "light", "emission", "emitter" and other forms of those words and phrases are used synonymously in the present description and refer to waves of electric and magnetic fields. Electromagnetic radiation useful for the methods of the present invention includes infrared light.

As used herein, "infrared radiation" is electromagnetic radiation having wavelength from 0.7 µm to 1000 µm. Infrared radiation has frequency of about 1 to 400 THz. As is known in the art, the actual wavelength or frequency value may differ from that measured, depending on the limits of the measurement systems used. Therefore, wavelengths and frequencies with some variance from those given, such as ±5% are intended to be included. Emitters of the invention emit infrared radiation when heated to an appropriate temperature. Emitters of the invention may also emit radiation in other portions of the electromagnetic spectrum. For example, emission wavelengths higher than 300 µm are possible using the teachings herein and an appropriate selection of parameters, as described herein. Also, emission wavelengths lower than 0.7 µm are possible using the teachings herein and an appropriate selection of parameters, as described herein. All ranges and individual values of emission are intended to be included in the description herein to the same extent as if listed separately. For example, the ranges 0.75-1.4 µm; 1.4-3 µm; 3-8 µm; 8-15 µm; 15-300 and 300-1000 µm are specifically included as useful emission ranges for the devices and methods described herein. In a particular embodiment, the range 2-15 µm is particularly identified and described.

As used herein, "narrow band" means the bandwidth of the emitted peaks is smaller than blackbody radiation emitted at that temperature. Examples of narrow band emission include 0.1 micrometer FWHM (full width at half the maximum emission intensity), 0.3 micrometer FWHM; 0.5 micrometer FWHM; 1 micrometer FWHM; 1.5 micrometer FWHM; 2.5 micrometer FWHM; about half of the wavelength of emission; less than about half the wavelength of emission, and all intermediate values and ranges. As is known in the art, it is sometimes difficult to obtain an exact value for measurements of peak width. For this reason, the values provided for FWHM are intended to include some measurement error, and include some variance from those given, such as ±5%.

As used herein, a "discontinuous" surface contains periodic or quasi-periodic features. "Feature" refers to a three-dimensional structure or component of a structure. Features may be recessed in which they extend into a surface or may be relief features embossed or raised on a substrate surface. Features include, but are not limited to, holes, trenches, cavities, vias, channels, depressions, posts, slots, pits, stands, columns, ribbons or any combination of these. The term feature, as used herein, also refers to a pattern or an array of structures. The term feature, as used herein, encompasses a 1-D, 2-D or 3-D pattern, and encompasses patterns of nanostructures, patterns of microstructures, patterns of larger structures, or a pattern of microstructures and/or nanostructures and/or larger structures. Features may extend the depth of a layer or may have a height or depth that is a portion of a layer. Examples of discontinuous surfaces include "perforated" where there are features that extend the height of the surface or a layer thereof; and "patterned" where there are features that do not extend the height of a layer. Discontinuous surfaces are also formed when a layer generally follows a feature, such as a layer that is deposited or otherwise formed on a feature, even though the actual surface of the layer may be smooth.

"Periodic" means that a structure or portion thereof has translational symmetry (or approximate translational symmetry). In one embodiment, periodic means that features are approximately (i.e., within ±10%) the same distance apart. Quasi-periodic means the structure is ordered, but not periodic. An ordering is nonperiodic if it lacks translational symmetry, which means that a shifted copy will never match exactly with its original. A structure may be periodic or quasi-periodic with the structure that is the closest in distance, or there may be a periodic or quasi-periodic arrangement in two dimensions with different structures, for example a surface may have intersecting patterns which each have periodic or quasi-periodic structures, but are not periodic or quasi-periodic if all structures are viewed together.

"Film" and "layer" are used interchangeably and refer to a coating or layer of atoms, molecules or ions or mixtures and/or clusters thereof. Films in the present invention may comprise a single-layer having a substantially constant composition, a single-layer having a composition which varies as a function of physical thickness or a plurality of film layers. Film layers of the present invention include but are not limited to dielectric materials, metals, semiconductors, conducting materials, organic materials such as polymers and any combinations of these materials. In an embodiment, reference to dielectric films in the present description includes but is not limited to metal oxide, metalloid oxide, nanoamorphous carbon and salt films. Film layers described may have any size, shape, physical thickness or optical thickness suitable for a selected application.

Conducting thin films and foils can be fabricated by a variety of methods, as known in the art. The thickness of the film can vary from a few micrometers to several millimeters. The perforation of the conducting film can be achieved with a variety of techniques including milling, laser drilling, metal injection molding, various etching techniques (wet etching, dry etching, plasma etching) or lift-off, as known in the art. The patterns to be transferred to the metallic film can be defined with lithography (photolithography, e-beam), holography, direct writing, molding or other patterning techniques.

Metallic surfaces may be coated with dielectric or other protective coating to prevent them from oxidizing or other environmental effects.

As used herein, "attach" does not necessarily mean a covalent bond is formed. Covalent or non-covalent interactions, such as hydrogen bonds, van der Waals interactions, ionic interactions, and other interactions may be formed when one structure attaches to another. "Attach" encompasses both chemical and physical attachments. The phrases "underlying" and "overlying" indicate the physical orientation of two structures when viewed in one orientation. As is known, these terms are relative. The phrases "underlying" and "overlying" include the concept of attached. Specifically, if one layer or film is underlying or overlying another layer or film, the two layers or films are attached together, as the term attach is described herein.

As used herein, "layer" does not necessarily mean that a complete layer is formed, but rather, defects or other areas of inconsistency may be found.

The discontinuous surface may have features that have any shape, such as round, oblong, square, rectangular, triangular, or irregular shaped, or a combination thereof. The shape of the feature is primarily dependent on the method used to form the feature, as known in the art. As used herein, a "square lattice" of relief features is an arrangement where four relief features form the vertexes of a square. The relief features themselves in a square lattice are not necessarily square; they may be circular, oval, square, rectangular, or any other convenient or desired shape. All arrangements of relief features, such as square lattice and other arrangements are included in the invention.

As used herein, "center wavelength of emission" is the wavelength (or small range of wavelengths, such as 10 s of nanometers) where the emission intensity is the highest average intensity for a given emission spectrum.

The following nonlimiting description is intended to provide examples of some embodiments of this invention. Applicant does not intend to be bound by the theory presented here.

Plasmonic Emitters

Plasmonic emitters allow use of the surface-plasmon polariton modes in a patterned conducting film to emit narrow band thermal radiation. When a surface or layer is discontinuated, the main surface plasmon polariton modes of the interface are changed. Surface plasmon polaritons (SPP) are coupled modes of light and surface plasma waves and are responsible for extraordinary transmission through holes, filtering and narrow band emission/absorption of light.

When a conducting surface that forms an interface with another material with different conductivity (such as a dielectric, another conducting film, or even air) is discontinuated with a periodic or quasi-periodic array of holes, with a hole-to-hole distance (for periodic structures) or average hole-to-hole distance (for quasi-periodic structures), a, ranging from a few millimeters to tens of micrometers, the thermal radiation from this device will consist of narrow band peaks in the infrared regime, their wavelength being scalable with a, therefore providing a narrow-band thermally driven infrared radiation source, an extraordinarily direct approach compared to other methods of generating infrared radiation.

The periodic or quasi-periodic discontinuation of the surface is all that is required for a narrow band infrared thermal radiation source. This structure emits infrared radiation efficiently by simply heating it, given that a is within the range given herein. Based on this basic principle, however, there are modifications that are made as described herein that result in emitters with spectral characteristics that would not have been expected.

The diameter of holes or pattern can be selected based on the information provided herein, and the necessary fabrication process parameters and desired result. In general, the larger the diameter of the holes or pattern, the broader the bandwidth of the emitted radiation. As the holes or pattern become more narrow, the emitted radiation has less power compared to large holes. In general, the wider the distance between holes, the longer emission wavelength.

The SPP mechanism results in emission peaks that are given by equation (1) below:

$$\lambda = a\left(\frac{4}{3}(i^2 + ij + j^2)\right)^{-1/2}\left(\frac{\varepsilon_1\varepsilon_2}{\varepsilon_1 + \varepsilon_2}\right)^{1/2} \quad (1)$$

where: a is the lattice constant, $\varepsilon_1$ and $\varepsilon_2$ are the real part of the dielectric constant of the two materials that form the interface, i and j are indices (1, 2, 3 . . . ) that give the SPP mode number. For example, (1,0), and (0,1) and modes are degenerate and are emitted at the same wavelength. The higher modes (i,j>1) are usually much weaker in power.

The metallic films typically used in plasmonic thermal emitters (PTEs) are prone to oxidization and structural damage at high temperatures. As a result, current metallic PTEs cannot be operated above 350° C., reducing the maximum achievable output power and limiting the emitted wavelengths to the long part of the mid-IR. In addition, metallic films exhibit very high internal stresses that prevent the fabrication of free-standing membranes, resulting in slow switching (heating/cooling) and low power efficiency due to the large thermal mass of the substrates typically used to support these metallic films.

In an embodiment, plasmonic emitters made from a highly conductive diamondlike (DL) material called nanoamorphous carbon (NAC) that overcomes these limitations, with significantly improved thermal and mechanical stability compared to their metallic counterparts. The emitted radiation has a bandwidth as small as 0.5 μm and can be tuned to the desired wavelength by changing the periodicity of the surface pattern and other aspects described herein, providing an efficient and low cost radiation source in the mid-IR.

The radiation emitting from the infrared emitter described here has a much narrower bandwidth of excitation than a black-body at the same temperature. Thus, the disclosed devices and methods are a simple yet efficient alternative to costly and complex light sources in the mid-IR, for example.

The following examples provide illustrations of some exemplary embodiments of the invention and are not intended to be limiting. The reference list appearing below Examples 1 and 2 below reflects the numbering in each example separately.

EXAMPLE 1

Nanoamorphous Carbon as a Blackbody Source in Plasmonic Thermal Emitters

This example describes one example of the use of nanoamorphous carbon as a blackbody source in plasmonic thermal emitters. Ag/dielectric/Ag type plasmonic thermal emitters (PTEs) following a hexagonal lattice were fabricated and their plasmonic emission spectrums were characterized with Fourier transform infrared spectroscopy. Nanoamorphous carbon (NAC) was used as a dielectric layer. Doping NAC with various materials over a wide range of levels enables control of the resistivity of the composite films. In an example, MoSi$_2$ was used as the dopant. Wavelength tuning in the range of 4-7 µm was demonstrated by changing the conductivity of the composite films as well as the lattice periodicity of the hexagonal lattice. The mechanical stability of the PTEs under mechanical strains was also tested.

Plasmonic thermal emitters (PTEs) in the mid-infrared (mid-IR) region of the electromagnetic spectrum have gained interest due to their broad range of applications in areas such as biosensors, thermal imaging, environmental monitoring and light emitting devices [1]. A typical PTE structure consists of an insulator thin film (~100 nm) sandwiched between two conductor thin films (~100 nm) on a substrate where the top conductor film is patterned with periodic structures [2]. The insulator film serves as a thermal blackbody source when it is heated. Typically, a two-dimensional hexagonal lattice structure is used to enable efficient coupling to surface plasmon polariton (SPM) and thus obtain a sharp emission peak with the peak wavelength given by equation 1 above.

In this example, the dielectric layer serves as a critical layer to couple light produced by heating or driving up the emitter by an external source to localized surface plasmon modes induced between the dielectric layer and patterned metal film interface. Using SiO$_2$ or Al$_2$O$_3$ as the dielectric it was shown that the position of plasmonic peak was independent of the type of the dielectric material therefore the wavelength tuning is usually achieved by changing the lattice periodicity. Typical conductor materials can be Au, Ag or in some cases highly conductive NAC thin films. Plasmonic thermal emitters are commonly fabricated on silicon or glass substrates. In the present Example, fabrication and characterization of PTE structures are described where nanoamorphous carbon (NAC) is utilized as a dielectric layer. The wavelength tuning is demonstrated both by manipulating the conductivity of NAC films using MoSi$_2$ as the dopant and also by changing the lattice constant of the patterned hexagonal structure from 4 to 7 µm. The structures described here show mechanical stability under 7% biaxial strain.

NAC has been studied for use as a conductor layer. Classified as a diamond-like carbon (DL) material, NAC consists of carbon networks that are characterized by a high relative ratio of carbon in sp$^3$ to sp$^2$ states. DL materials have important applications in areas that require high conductivity and dielectric constant, high mechanical and temperature stability, and biocompatibility. Undoped NAC films have conductivity on the order of $10^{-10}$ S/cm, enabling their use as insulators. Highly conducting NAC films can be obtained through metal doping, in which case conductivity of $10^3$ S/cm can be achieved. Metal additives incorporated in carbon networks of NAC films contribute to the conductivity and dielectric constant of the film similar to the previous studies shown for DLC. Hence, a wide range of doping can be utilized as a control parameter for tuning the plasmonic peaks of PTE structures. Another advantage of composite diamond-like carbon thin films is that they are known to provide improved adhesion and improved mechanical stability of PTEs.

In order to fabricate the PTEs in this Example, a uniform 100 nm layer of silver was deposited by thermal evaporation onto a cleaned substrate. Undoped NAC and NAC doped with MoSi$_2$ films of 100 nm thickness were deposited by PECVD system with DC magnetron sputtering of metal target and using HMDSO and C$_2$H$_2$ as precursors. Finally, a 100 nm silver layer was deposited on top of the dielectric layer. Periodic hole arrays with lattice constants ranging from 4 µm to 7 µm were patterned in the top silver layer by standard photolithography. A photoresist layer (PR) was spin coated on top of the silver layer and a mask was used to pattern hexagonal structures on the top silver film. After development, silver was etched in NH$_4$OH:H$_2$O$_2$:H$_2$O (1.5:1:20) and the PR layer was removed with acetone and isopropyl alcohol.

FIG. 1 shows the normalized plasmonic emission spectrums of Ag/NAC/Ag, Ag/NAC:MoSi$_2$/Ag and Ag/SiO$_2$Ag based PTEs on glass substrates, all with a periodicity of 4 µm. All the dielectric films were deposited in PECVD system. The magnetron power was the control parameter in order to achieve the dielectric films with desired resistivity. The inset in FIG. 1 shows the relationship between the measured resistivity values of composite NAC:MoSi$_2$ films and the magnetron power. Undoped NAC films were produced with magnetron power of P=0 W first. For MoSi$_2$ containing NAC films, the RF bias and ion current were kept at 100 W and 2.5 A, respectively. By increasing the magnetron power up to P=85 W, lower resistive (or higher conductive) films were produced. The resistivity was measured with PRF-922B probe of Prostat Company. The resistivity of undoped NAC films were found to be on the order of $10^{10}$ Ω·cm with magnetron power of P=0 W. A sudden decrease in resistivity was observed between the resistivity values of $10^9$ to $10^7$ Ω·cm for higher magnetron power similar to Ti doped NAC films. A decrease in the resistivity of composite films were obtained and the resistivity decreased up to $10^7$ Ω·cm for NAC:MoSi$_2$ C. Finally, Ag/SiO$_2$/Ag devices on glass were fabricated and all samples were placed on a miniature hot plate and heated up to 260° C. The emission spectrums were collected on a Nicolet 6700 FT-IR spectrometer. A shift of 2.06 µm was obtained, as can be seen in FIG. 1. A slight shift between the plasmonic peaks of SiO$_2$-based and NAC-based PTEs were observed at 4.61 and 4.74 µm, respectively. The index of refraction (dielectric constant) of SiO$_2$ and NAC were calculated as 1.32 (1.76) and 1.37 (1.87) from Eq. 1 above. These results represent close agreement. This also agrees with previous work where the position of the plasmonic peak was independent of small dielectric constant differences. The index of refraction (dielectric constant) of NAC in the near infrared was reported as 2.2 (4.41) at 1.4 µm [13]. Thus, the change in refractive index of NAC from 2.2 to 1.87 is most likely caused by normal dispersion. Similarly, the dielectric constants of other samples were calculated and the highest dielectric constant of 3.84 was calculated from Eq. 1 for NAC:MoSi$_2$ C.

Figure 2:
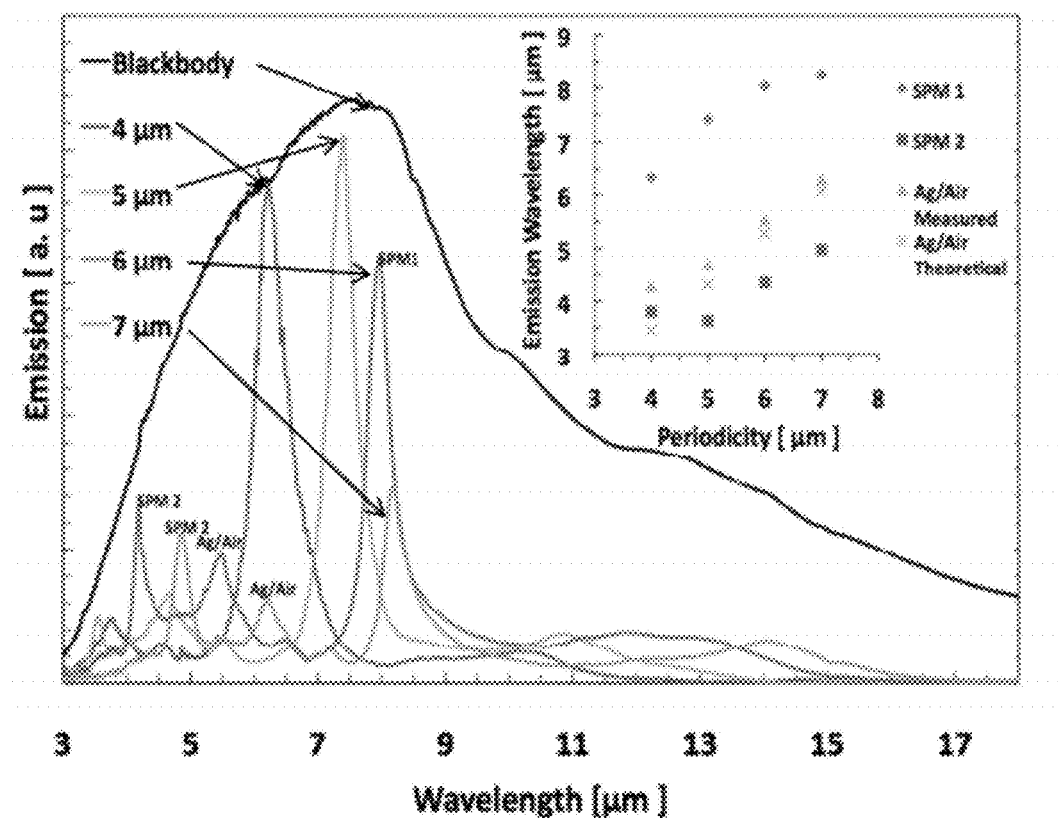
FIG. 2 shows the emission spectra of PTEs with lattice constants of 4, 5, 6, and 7 μm versus the blackbody emission spectrum of a 170 nm thick NAC:$MoSi_2$ film at 180° C.

The effect on plasmonic emission peak by changing the lattice constant was also studied. Plasmonic emissions from PTEs with periodicities of 4, 5, 6 and 7 µm for a 170 nm thick NAC:MoSi$_2$ emission layer are shown in FIG. 2. One strong metal/dielectric mode (SMP1) was observed for PTEs with 4 and 5 µm. However, together with the silver/air mode, a higher order silver/NAC mode (SPM2) is enhanced and becomes more pronounced in the spectra for larger periodicities of 6 and 7 µm. The emission peak for a PTE with a periodicity of 5 µm, which has the highest intensity peak value, is centered at 7.45 µm which is very close to the peak position of blackbody emission that occurs at 7.7 µm. However, the peak values start to reduce as they occur further away from the blackbody peak. This indicates that the strength of the emission peaks follow the blackbody emission spectrum of the 170 nm thick NAC:MoSi$_2$ film. The inset shows the dependence of the emission peak position on the lattice period for each SPM. Theoretical values of silver/air modes were obtained from Eq. 1 by using $\epsilon_{Ag}$=−8.34×10$^2$, −1.31× 10$^3$, −1.88×10$^3$ and −2.55×10$^3$ for the periodicities ranging from 4 to 7 µm and comparing to the measured values. Theoretical and experimental results are in good agreement as it is shown in the inset of FIG. 2. The amount of the shift is not linearly dependent on the period. This may be due to the large dispersion of NAC:MoSi$_2$ in this wavelength range.

Figure 3:
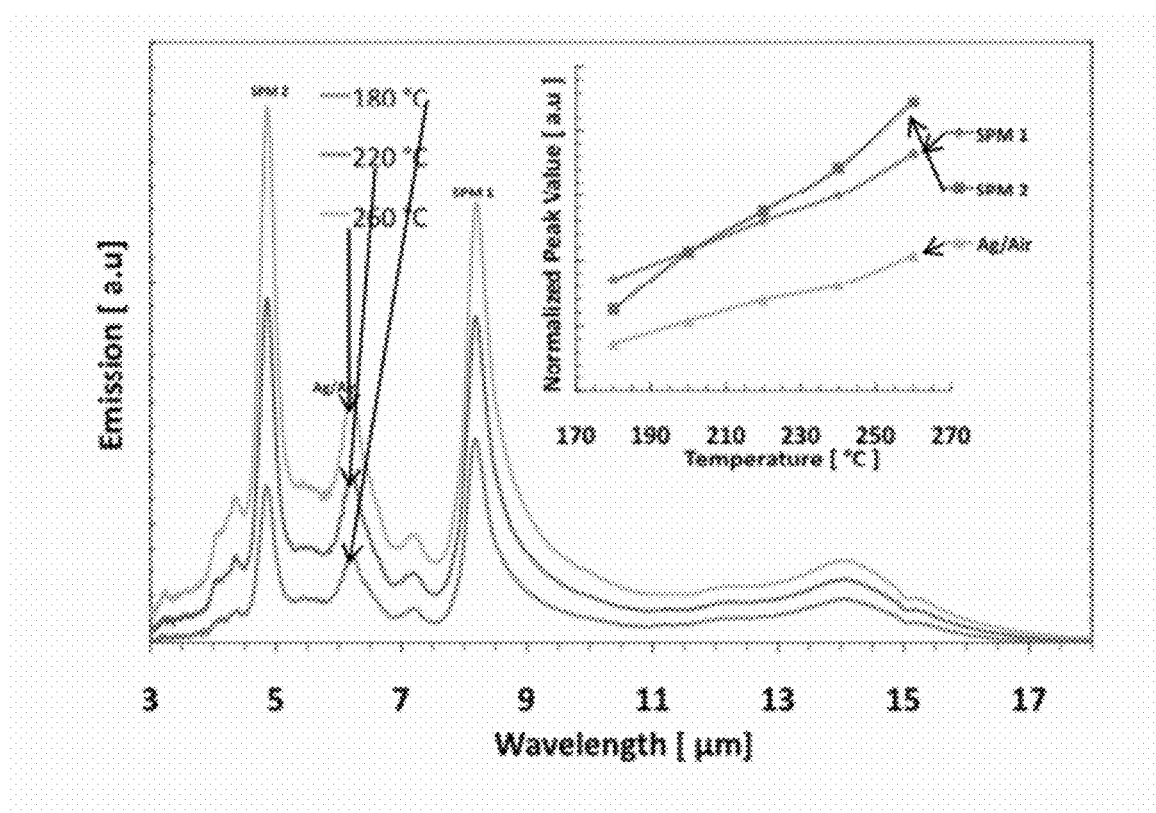
FIG. 3 shows the emission spectra of the PTE structure Ag/NAC:$MoSi_2$(170 nm)/Ag with periodicity of 7 μm at 180, 220 and 260° C. The inset shows the variation in peak values as the temperature changes from 180 to 260° C.

As the temperature increases, the blackbody spectrum shifts to lower wavelength and results in enhanced modes that are closer to the blackbody peak. This presents an opportunity to tune the secondary silver/dielectric modes (SPM2) of PTEs with periodicities of 6 and 7 µm. FIG. 3 shows plasmonic spectra for a PTE with a periodicity of 7 µm as measured at 180, 200 and 260° C. Plasmonic peaks exhibited no shift over this range of temperatures as was expected. However, SPM1 experiences a 100% increase in intensity whereas SPM2 and the silver/air mode experience 245% and 200% increases in intensity, respectively. The peak values for SPM1 and SPM2 become equal at the threshold temperature of 200° C. This phenomenon was not observed for 4 and 5 µm periodicities, simply because there was only one strong plasmonic peak and it was always near the blackbody peak at temperatures between 180 to 260° C.

Figure 4:
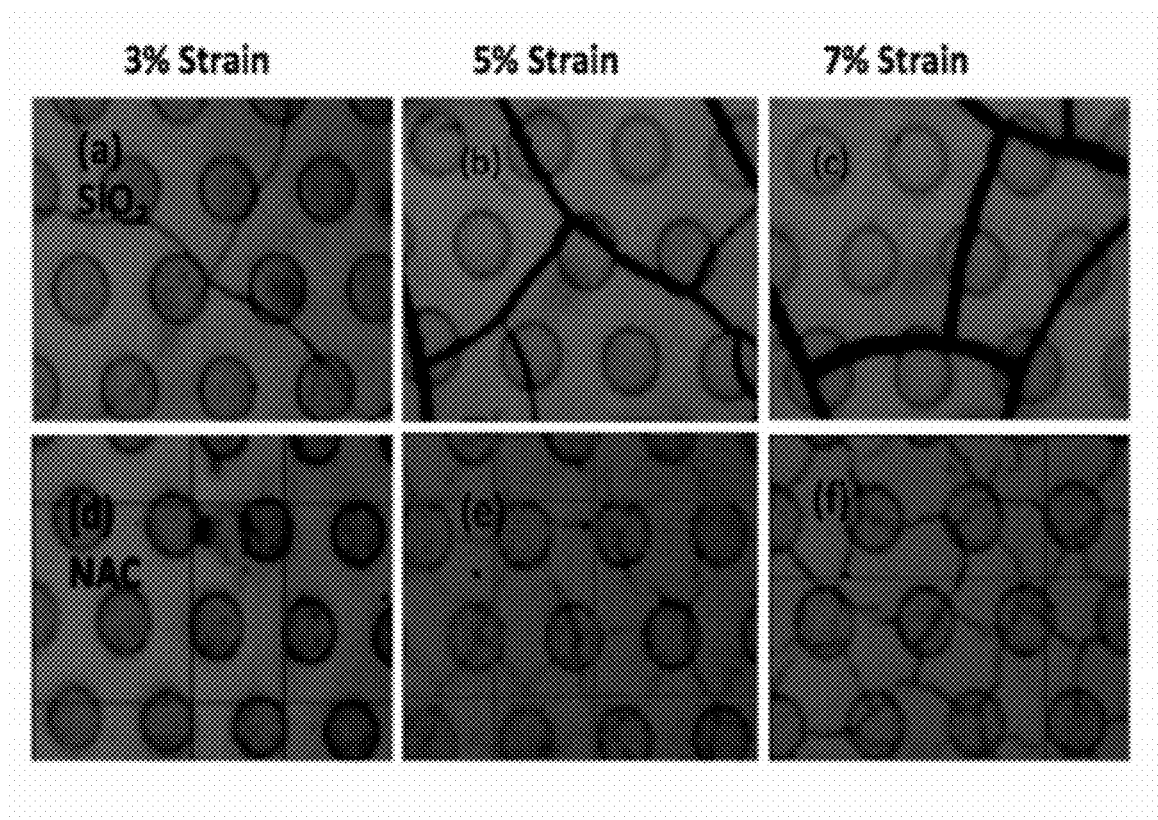
FIG. 4 shows the effect of mechanical strain of (a) 3%, (b) 5% and (c) 7% on Ag/$SiO_2$/Ag (100 nm each) and of (d) 3% (e) 5% and (f) 7% on Ag/NAC/Ag (100 nm each).

Finally, the mechanical stability of NAC was tested and compared to that of $SiO_2$ by bending and mechanical strain. A biaxial tensile strain was produced by 4 mm steel sphere and a micrometer screw similar to that was shown in the reference [15]. FIG. 4 shows optical microscope pictures after 3, 5 and 7% biaxial strains were applied. As it can be seen in the top row (a)-(c), $SiO_2$ starts to crack around 3% strain. Further strains at 5 and 7% cause wider cracks in the PTE. As shown in the bottom row (d)-(f), NAC shows better mechanical stability to applied mechanical strains. Even at 7% strain, the NAC based PTE has only micro-cracks. This can be attributed to higher elastic modulus of NAC (200-450 GPa vs. 75.2±4 GPa for $SiO_2$).

In conclusion, narrow band (as low as ~0.5 µm) plasmonic emission was obtained in NAC-based PTEs and plasmonic shift of slightly over 2 µm was achieved by reducing the resistivity of the dielectric layer. This technique offers excellent flexibility in designing and fabricating PTEs at a desired wavelength in mid-IR. The wavelength tuning was also demonstrated by changing the lattice constant for 4-7 µm and the plasmonic emission peaks were compared to blackbody curve. An enhancement in the higher order SPMs was observed when the periodicity was increased above 6 µm. The relation between the main SPM and higher order SPMs was studied by changing the temperature. Additionally, high quality NAC films helped improve the mechanical stability of flexible PTEs up to 7% of induced strain by using NAC as an emissive layer.

REFERENCE LIST FOR EXAMPLE 1

1. H. Kaplan, Practical Applications of Infrared Thermal Sensing and Imaging Equipment (SPIE, Bellingham, Wash., 2007).
2. I. El-Kady, R. Biswas, Y. Ye, M. F. Su, I Puscasu, M. Pralle, E. A. Johnson, J. Daly and A. Greenwald, "Tunable narrow-band infrared emitters from Hexagonal lattices", Photonics Nanostruct, Fundam. Appl. 1, 69 (2003).
3. Q. Wei, R. J. Narayan, A. K. Sharma, J. Sankar, and J. Narayan, "Preparation and mechanical properties of composite diamond-like carbon thin films", J. Vac. Sci. Technol. A 17(6), 3406-3414 1999.
4. S. Tay, A. Kropachev, I. E. Araci, T. Skotheim, R. A. Norwood and N. Peyghambarian, "Plasmonic thermal IR emitters based on nanoamorphous carbon", Appl. Phys. Lett. 94, 071113 (2009).
5. I. E. Araci, V. Demir, A. Kropachev, T. Skotheim, R. A. Norwood, N. Peyghambarian, "Mechanical and thermal stability of plasmonic emitters on flexible polyimide substrates", Appl. Phys. Lett. 97, 041102 (2010).
6. M. Moseler, P. Gumbsch, C. Casiraghi, A. C. Ferrari and J. Robertson, "The ultrasmoothness of diamond-like carbon surfaces", Science 309, 1545 (2005).
7. A. A. Zakhidov, R. H. Baughman, Z. Iqbal, C. Cui, I. Khayrullin, S. O. Dantas, J. Marti, and V. G. Ralchenko, "Carbon Structures with Three-Dimensional Periodicity at Optical Wavelengths", Science 282, 897 (1998).
8. Data taken from Intex Inc. can be found at http://www.eoc-inc.com/infrared_ir_pulsable_sources.htm.
9. Q. F. Huang, S. F. Yoon, Rusli, H. Yang, B. Gan, Kerlit Chew and J. Ahn, "Conduction mechanism in molybdenum-containing diamond-like carbon deposited using electron cyclotron resonance chemical vapor deposition", Journal of Applied Physics 88, 7 (2000).
10. Q. F. Huang, S. F. Yoon, Rusli, Q. Zhang and J. Ahn, "Dielectric properties of molybdenum-containing diamond-like carbon films deposited using electron resonance chemical vapor deposition", Thin Solid Films 409, 211-219 (2002).
11. Q. Wei, R. J. Narayan, A. K. Sharma, J. Sankar, and J. Narayan, "Preparation and mechanical properties of composite diamond-like carbon thin films", J. Vac. Sci. Technol. A 17(6), 3406-3414 1999.
12. http://www.prostatcorp.com
13. R. A. Norwood, H. Sumimura, S. Tay, K. Yamnitsky, A. Kropachev, J. Thomas, N. Peyghambarian, J. H. Moon, Y. Shu, T. Skotheim, "New organic infiltrants of 2-D and 3-D photonic crystals", Proc. SPIE, ISSN 0277-768 (2006).
14. M. A. Ordal, L. L. Long, R. J. Bell, S. E. Bell, R. R. Bell, R. W. Alexander, Jr., and C. A. Ward, "Optical properties of the metals Al, Co, Cu, Au, Fe, Pb, Ni, Pd, Pt, Ag, Ti, and W in infrared and far infrared", Appl. Opt. 22, 1099 (1983).
15. K. J. Kim, J. K. Seo, and M. C. Oh, "Strain induced tunable wavelength filters based on flexible polymer waveguide Bragg reflector", Opt. Express 16, 1423 (2008).
16. U. Beck, D. T. Smith, G. Reiners, S. J. Dapkunas, "Mechanical properties of $SiO_2$ and $Si_3N_4$ coatings: a BAM/NIST co-operative project", Thin Solid Films, 332, 164-171 (1998).

EXAMPLE 2

Mechanical and Thermal Stability of Plasmonic IR Emitters on Flexible Polyimide Substrates $Ag/SiO_2/Ag$ plasmonic thermal infrared emitters with different hexagonal lattice periods were fabricated on flexible polyimide (PI) membranes in this example. These devices show high temperature resistance (stable at more than 400° C.) and comparable coefficient of thermal expansion (CTE) (~30 ppm/° C. at 200° C.) with metallic films. The emission peak linewidth was as low as 0.4 µm where the emission peak wavelength was around 4.5, 5.2, 6.5, and 7.2 µm for corresponding hexagonal lattice periodicities. The effects of temperature and mechanical strain on the spectral and structural properties of the flexible emitter were also evaluated. The low heat conductivity (0.11 W/m·K, an order of magnitude smaller than glass) and low thermal mass of thin free standing PI substrates enables IR emitters with low power consumption (<1 W) and fast switching time (in the order of ten milliseconds).

Figure 5:
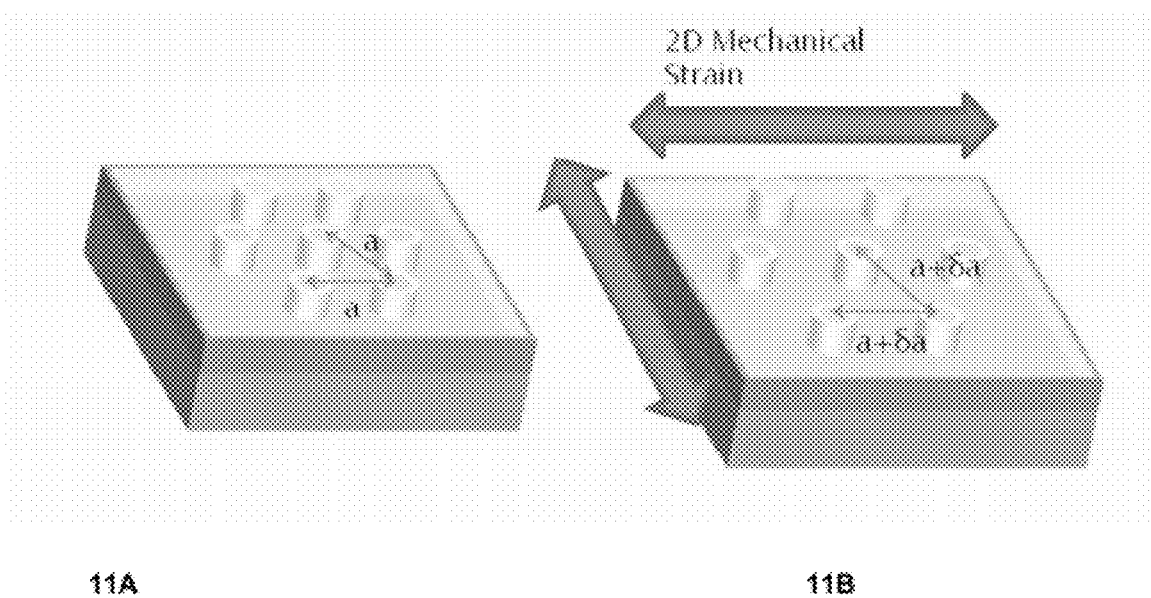
FIG. 5 shows two views of a perforated structure.

As has been described elsewhere herein, when a conducting surface that forms an interface with an insulator on a self-standing flexible film is perforated with a periodic or quasi-periodic array of holes, with a hole-to-hole distance (for periodic structures) or average hole-to-hole distance (for quasi-periodic structures), a, the thermal radiation from this device will consist of narrow band peaks (compared to black body radiation) in the mid-wavelength infrared regime and applying an external force on the self-standing flexible film will induce a strain and hence a change in periodic structure. That change is used to assist in actively tuning the emission peak. FIG. 5 provides a schematic of the application of 2D mechanical strain and the change in periodicity. FIG. 5A shows a strain-free view. FIG. 5B shows a stretched film due to axial strain.

Due to the elasticity of the flexible films this tuning can be reversible. Polyimide films are excellent candidates for high temperature applications due to their resistance up to 400 deg C. This discovery is described in this Example.

Figure 6:
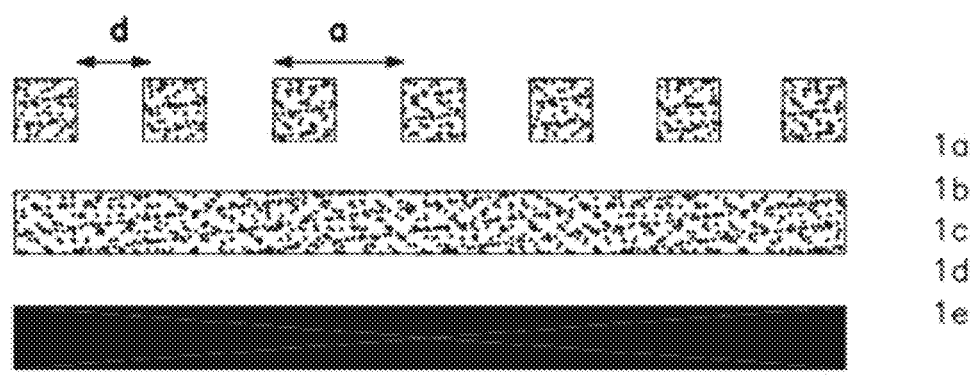
FIG. 6 shows an exemplary structure. 1a. perforated conductive layer; 1b. dielectric film; 1c. metallic film; 1d. flexible substrate; 1e. glass or semiconductor substrate. The layers and their use are further described herein.

A schematic example of a mid-wavelength (mid-IR) radiation emitter is the structure shown in FIG. 6. This is a profile view of the emitter, i.e., an insulator deposited followed by a thin conductive layer (metal film) on top of self standing polyimide film. Another layer of thin metallic film is deposited on the insulator and perforated with periodic or quasi-periodic hole arrays. The hole-to-hole distance, a, is the lattice constant and d is the hole size. The layer 1e in FIG. 6 can be removed if desired. When heated, the emission spectrum from the periodic or aperiodic structure becomes significantly different from an unpatterned structure, i.e., the black body radiation becomes narrower and shifted toward a desired wavelength that can be chosen depending on the periodic/aperiodic structure.

As described elsewhere herein, plasmonic emitters commonly have a thin (~100 nm) dielectric film layer, i.e. $SiO_2$, sandwiched in between two conducting films (~100 nm each). The conducting films are usually metals like silver or gold or in some cases they can be metal doped amorphous carbon.[2] In this configuration, the dielectric film layer serves as a blackbody source when heated. Emission from the blackbody source couples into the surface plasmon polariton (SPP) modes of the conducting films. In order to efficiently couple emission from blackbody source to SPP's, one or both [3] of conducting layers has to be periodically patterned to satisfy momentum conservation.[1,4] The three layer sandwich system forms a resonant structure which enhances the emission efficiency.[5] The emission peak wavelength is proportional to the period of patterned structure and it can be controlled by changing the periodicity according to the formula (1) above.

Any change in the lattice constant by applying a mechanical strain perpendicular to the polymer film or axially stretched film will result in a change in the emission peak of the SPP mode according to Formula 2:

$$\lambda + \delta\lambda = (a + \delta a)\left(\frac{4}{3}(i^2 + ij + j^2)\right)^{-\frac{1}{2}} \left(\frac{\varepsilon_1 \varepsilon_2}{\varepsilon_1 + \varepsilon_2}\right)^{\frac{1}{2}} \quad (2)$$

Another control parameter for changing the emission wavelength is plasmonic mode coupling efficiency. In one report, the emission wavelength red shifts by as much as 0.8 μm as the $SiO_2$ layer thickness gets smaller and the coupling increases. [6]

Other commercial thermal emitters fabricated as 2 μm free standing membranes have low power consumption (<1 W for operation at 750° C.).[7] In addition, their response time is in the range of 10 msec due to low thermal mass. However, since plasmonic thermal IR emitters (PTE) are commonly fabricated on silicon or glass substrates, the large thermal mass of these substrates causes the power consumption to be high (18 W)[1] and heating and cooling times to be long. In order to more efficiently utilize PTEs, there is a need for substrates with low thermal mass. Polymer substrates are flexible, lightweight, and of small volume. However, internal stress, which can be caused by rapid temperature changes or mechanical effects, in the metallic or dielectric films, can result in the damage to the PTEs when thin flexible substrates are used.

To overcome these difficulties, polyimide (PI) films were used. PI films are useful for flexible PTE platforms due to their high temperature resistance (stable at greater than 400° C.), and comparable coefficient of thermal expansion (CTE) (~30 ppm/° C. at 200° C.) with metallic films.[8,9] The commercial PI material, Kapton is used in the microelectronics industry and the mechanical and thermal properties of this material have been studied. [8,10] Moreover, thin PI substrates have been used as flexible heaters that can be used at temperatures up to 260° C.[11] In addition to being flexible, due to the low thermal conductivity (0.11 W/m·K, an order of magnitude smaller than glass) and the low thermal mass of thin PI films, the power consumption and the switching times of the free standing plasmonic emitters can be reduced significantly. It was demonstrated that PTEs on PI films have good thermal stability up to 270° C. and their performance is not degraded by bending and mechanical strain (up to 3%).

In order to fabricate flexible PTEs, a 25 μm thick HN type Kapton film was used. First, a 2" by 3" microscope slide was cleaned with acetone and isopropyl alcohol. Next, the PI film was bonded on the glass substrate by using an adhesive epoxy to improve mechanical and thermal stability during the rest of the fabrication process. 100 nm of Ag, $SiO_2$ and Ag layers were successively ion beam sputtered without breaking the vacuum in an Oxford deposition system. This ensured good adhesion of the sputtered films. A photoresist (PR) layer was spin coated on the top Ag layer. A mask with periodic structures (hexagonal lattice periods changing from 4-7 μm) was used to pattern the PR layer by using standard UV lithography techniques. Ag was etched in diluted (1:20 distilled water) base piranha solution for 20 seconds and the PR layer was then cleaned with acetone and isopropyl alcohol. Finally, the PI was gently peeled off the glass substrate. Short heat treatment at 150° C. provides for easy removal of the PI layer.

Figure 7:
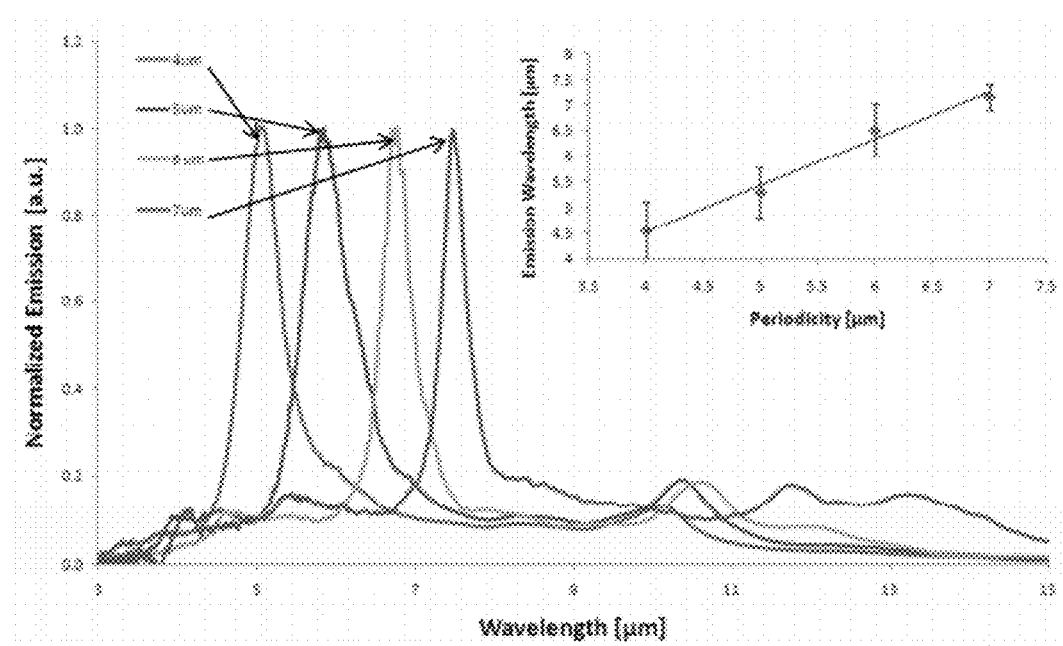
FIG. 7 shows the FTIR spectrum of the emission from flexible plasmonic IR emitters with 4, 5, 6 and 7 μm periods. The highest peak belongs to Ag/$SiO_2$ SPP mode. The inset shows the emission wavelength dependence on the periodicity.

The free standing flexible plasmonic emitters were placed on a miniature hot plate and their emission spectra were collected using an FTIR. FIG. 7 shows the normalized emission spectra of flexible PTEs with 4, 5, 6 and 7 μm periods. The corresponding emission wavelengths were around 5, 5.7, 6.8 and 7.5 μm, respectively. Linewidths of 0.7 μm and 0.4 μm was measured for periods of 4 μm and 7 μm, respectively. In order to measure the reproducibility, three batches of devices were fabricated and measured similarly. The inset In FIG. 7 shows the change in the emission wavelength as the periodicity varies. Each point is the average value of the emission wavelength measured for the three different batches. The error bars show the standard deviation of the mean emission wavelengths measured from the three samples. The standard deviation was around 0.5 μm. Relatively high standard deviation is likely caused from variations in the coupling conditions of the plasmonic modes which may result from non-uniform PI film quality and slight variations in the deposition conditions.

Figure 8:
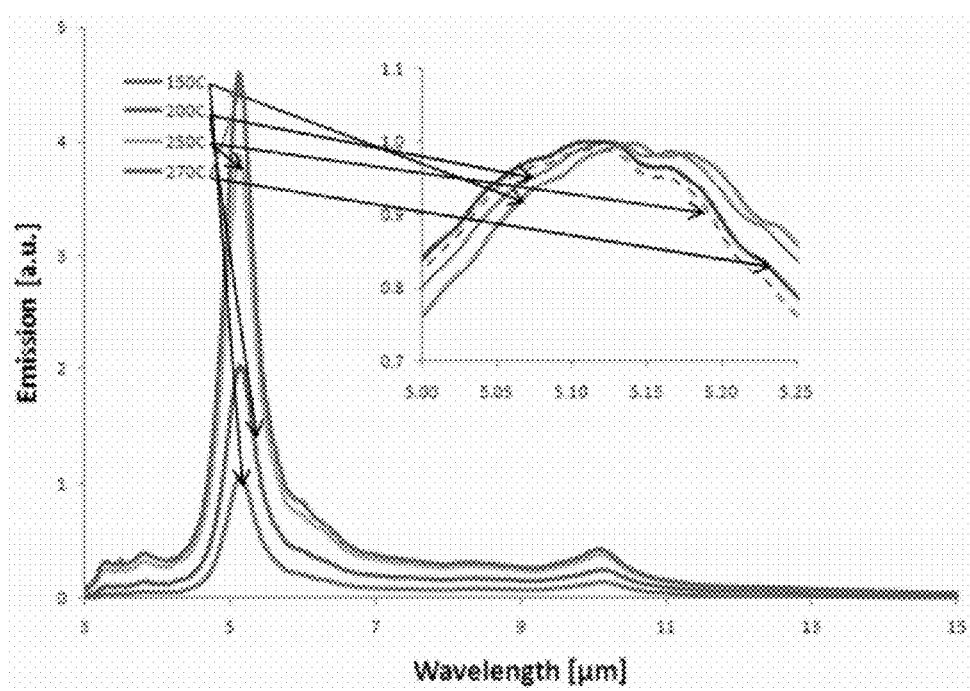
FIG. 8 shows temperature dependence of plasmonic emission from ion beam sputtered Ag/$SiO_2$/Ag structure on PI film. Lattice periodicity was 4 μm. The inset shows a detailed view of the emission peak. The dashed curve is the emission peak when the device temperature is reduced from 270° C. to 150° C.

FIG. 8 shows the temperature dependence of the emission from the flexible PTEs. The temperature was increased from 150 to 270° C. on the same device. There was no significant change in the spectrum shape as the devices were heated and cooled down several times. However, a peculiar phenomenon was observed. The inset shows a blue shift in the emission peak wavelength as the temperature increases. The shift is in agreement with PI contraction at elevated temperatures.[9]

Figure 15:
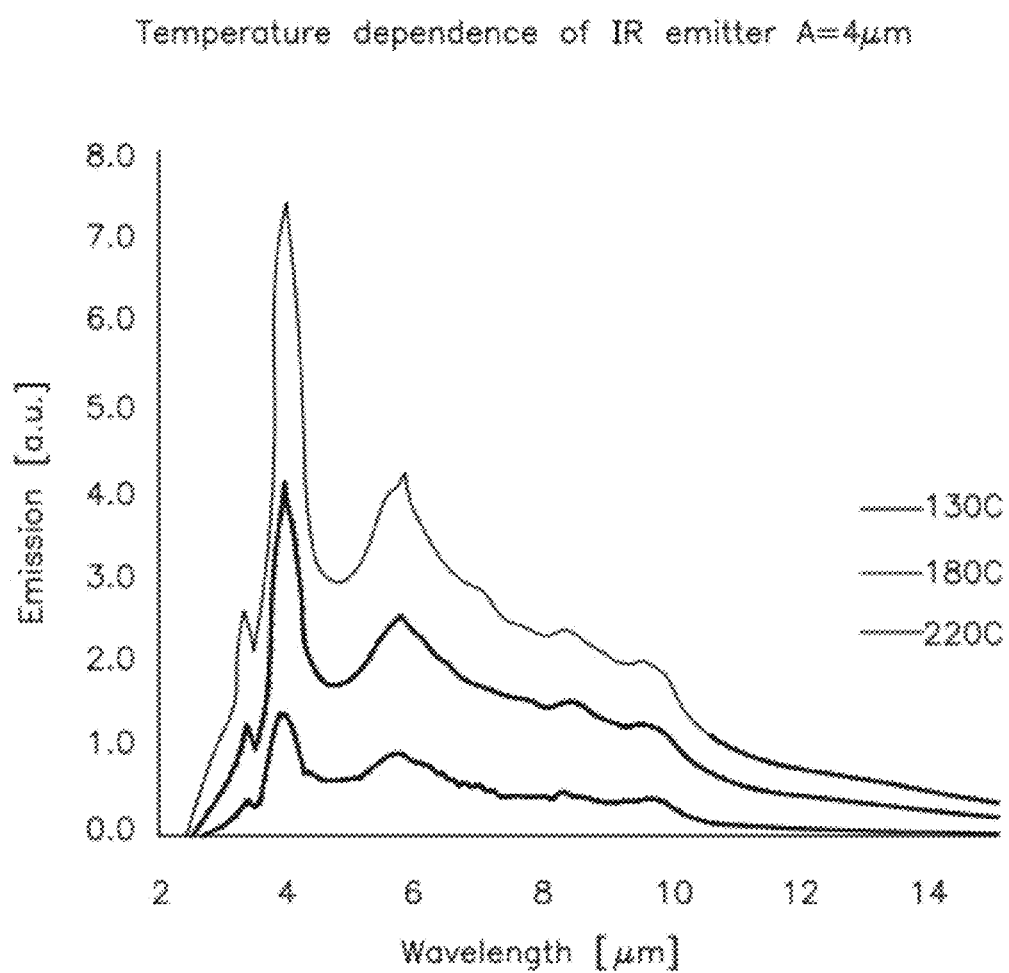
FIG. 15 shows temperature dependence of the IR emitter of Example 2 with a=4 µm.

The thermal contraction (−1% at 200° C.) induces a reduction in the periodicity and causes a blue shift according to the formula (1). However, this is a one time event and is not observed again as the sample cools down and re-heated. The dashed curve in the inset shows the emission after the sample was cooled down to 150° C. and demonstrates that the wavelength remains constant after PI contraction. FIG. 15 provides another example of this measurement on a different device using a=4 um.

Figure 9:
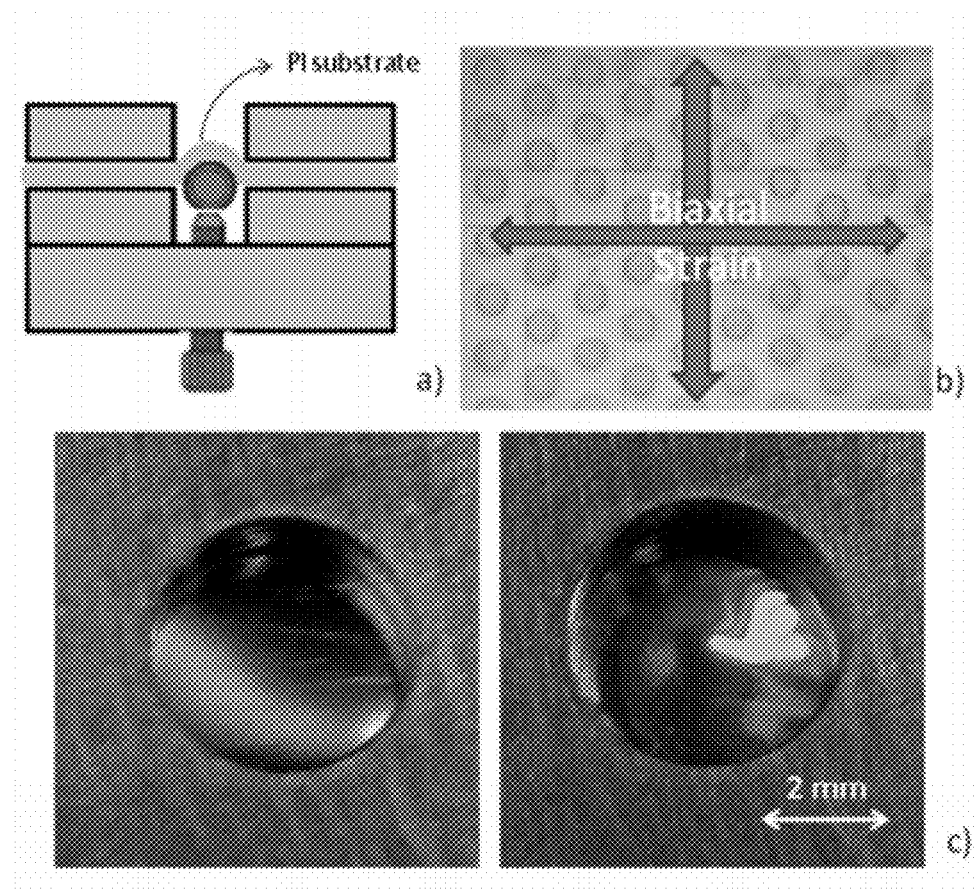
FIG. 9 shows the illustration of the fixture used to apply biaxial stress b) Microscope picture of the PTE structure showing the direction of stress c) Photograph of the flexible PTE; no strain (left) and under strain (right).

Finally, the flexible PTEs were tested under bending and mechanical strain. There was no visible damage on the devices and no changes in the emission spectra were observed after samples were bent to 1 mm radius and released. The effects of mechanical strain on the metallic films on PI substrates have been studied.[8-10, 12] In these studies the metal/PI samples were subjected to uniaxial tension. The emission spectra of PTEs are dependent on the lattice type and in order to maintain hexagonal lattice structure under stress symmetrical biaxial tension was applied as illustrated in FIG. 9b. This strain was applied using the fixture shown in FIG. 9a. A 4 mm diameter steel sphere and a micrometer screw were used to apply force and produce biaxial tensile strain on the PI film with a system similar to shown by Ken et. al.[13] The mechanical strain is approximately calculated by measuring the average distance between the holes on the Ag film. Up to 13% strain has been measured. FIG. 9c shows the photographs of the flexible PTE placed on the fixture (left) and under stress (right). There was no delamination or any other visible damage to the PTE structure up to 13% strain.

Figure 10:
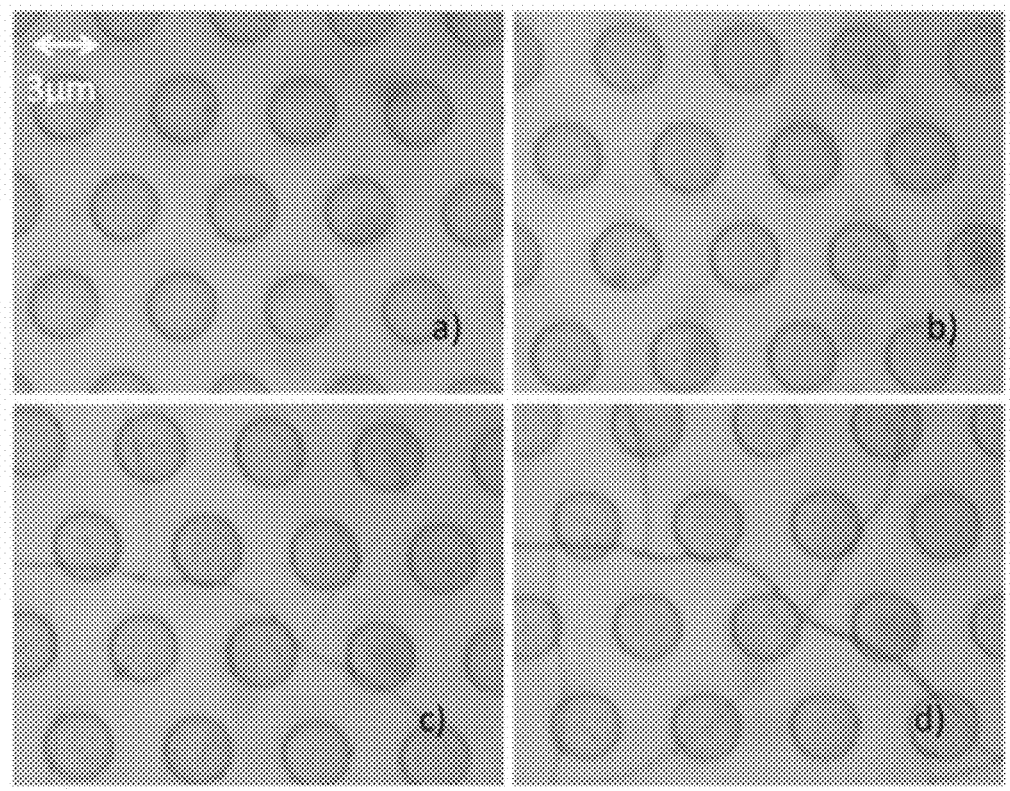
FIG. 10 shows the microscope pictures showing the effect of the mechanical strain. a) No strain b) 1% c) 2% d) 3% strain measured.
Figure 11:
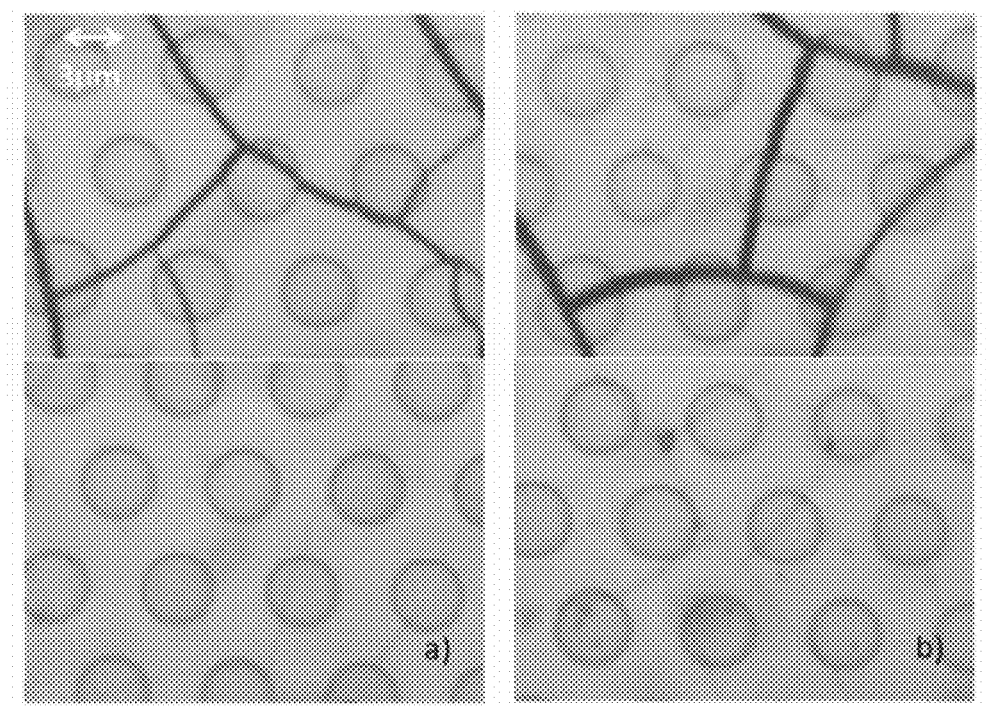
FIG. 11 shows the effect of annealing at 250° C. a) After 5% strain (top) measured annealed at 250° C. (bottom) b) After 7% strain (top) measured annealed at 250° C. (bottom).

The microscope pictures in FIG. 10 show the PTE structure before the stress was applied (a) and for 1% (b) 2% (c) and 3% strain (d). Cracks in the $SiO_2$ film became visible just above 1% strain and increased gradually as the stress level increased. However, when the stress was removed from the film and the samples were annealed at 250° C. for a minute, a remarkable self-healing phenomenon was observed, where the PTE structure completely recovered and no cracks were seen. FIG. 11 shows the microscope pictures of the samples before (top) and after annealing (bottom) for 5% (a) and 7% (b) strain. The recovery of the PTE structure after annealing is clearly seen. For more than 5% strain only partial recovery of the PTE was achieved. This may be due to damaging of the top and bottom Ag film.

Figure 12:
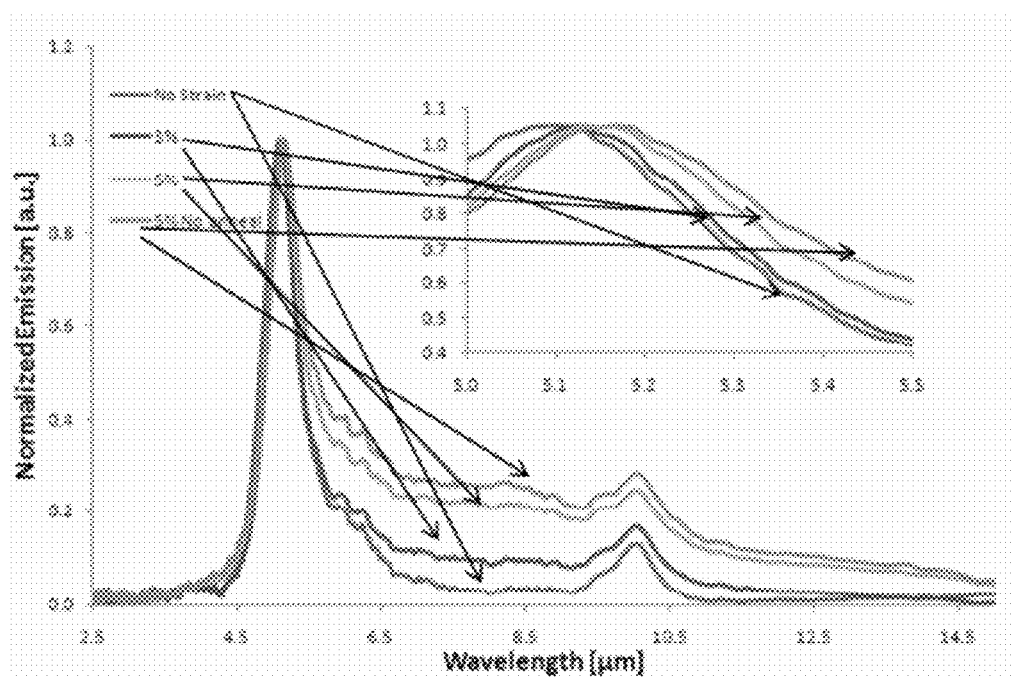
FIG. 12 shows the effect of mechanical strain on the emission spectrum. Each emission spectrum is collected at 150° C. The top curve shows the emission before annealing and second-to-top curve shows after annealing at 250° C. for the sample with 5% strain. The inset shows the peak emission wavelength region in more detail.

The effect of mechanical stress on the emission spectra is shown in FIG. 12. Each spectrum was collected at 150° C. Experimental procedure followed in these experiments was as follows. Initially tensile strain was imposed on the PI substrate at room temperature. The stress was removed from the sample and the sample was annealed at 250° C. before collecting the emission spectrum at 150° C. In support of the self-healing phenomenon observed visually under the microscope, there was a minor change in the emission spectrum for the samples up to 3% strain. However, when the strain was increased to 5%, the background emission at longer wavelengths was significantly increased. The inset shows the detailed view of the emission peak. It is observed that there was about a 1% red shift in the emission wavelength, which might be due to the 1% periodicity increase enabled by the $SiO_2$ flexibility. However, as the strain increases, the $SiO_2$ undergoes a mechanical deformation and no further wavelength shift occurs.

Figure 13:
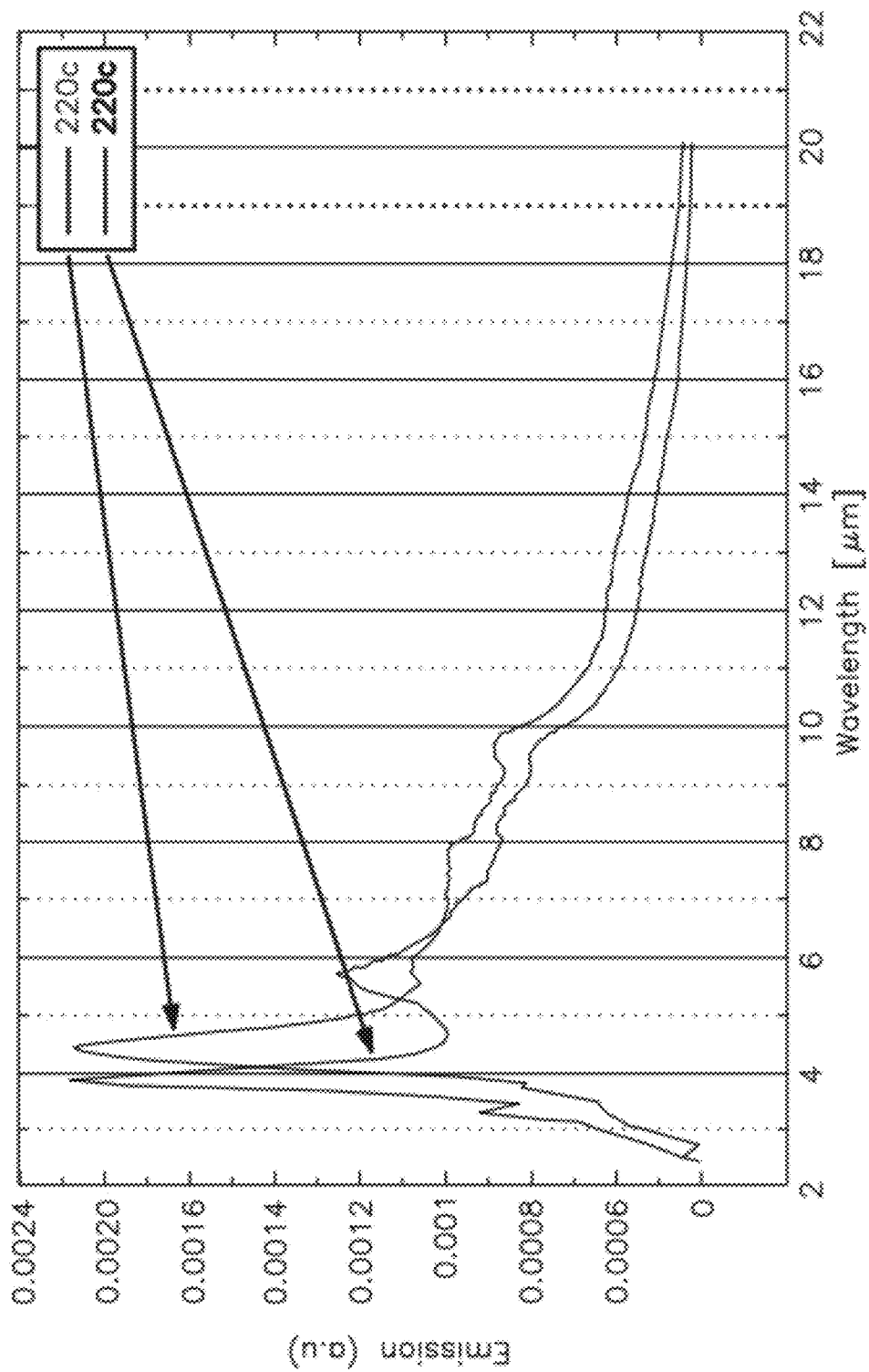
FIG. 13 shows emission from a periodic structure where there is no mechanical strain applied and where strain is applied. The identification of the spectra is described below.
Figure 14:
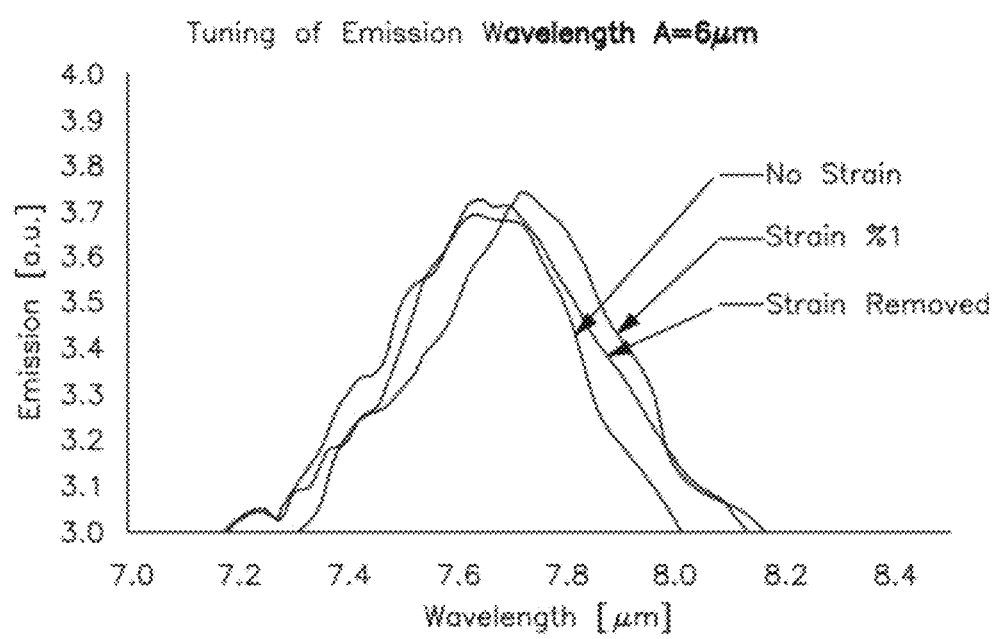
FIG. 14 shows emission wavelength shifts and recovery with application and removal of strain.

In another experiment, shown in FIG. 13, additional data collected was shown. The emitter for this experiment was fabricated by coating 100 nm silver, 100 nm silica and 100 nm silver on top of a commercially available polyimide film. The top silver layer was perforated with a hexagonal lattice of holes with a=4 micron and d=2 micron. The data was collected using an FTIR spectrometer at a constant temperature. The "non-strain spectrum" shows strong emission around 3.9 micrometers with a bandwidth of ~0.5 microns. In the "strain" curve, a shift of 0.6 microns when about 15% mechanical strain is applied was seen. FIG. 14 shows the reversible tuning due to elasticity of the polyimide film in the device described for FIG. 13. A small force was applied and a wavelength shift proportional to induced strain is observed. When the applied force was removed the emission wavelength returns back to original position.

In conclusion, PTEs on flexible free standing PI substrates were fabricated. The low thermal mass and low heat conductivity of the PI substrates are advantageous in order to obtain narrow band emitters with high power efficiency and fast switching. The thermal and mechanical stability of the PTEs were investigated. Good thermal and mechanical stability were seen due to high temperature resistance of the PI film and CTE match of PI substrate and Ag film. Several notable phenomena were observed during these experiments. First was the blue shift in the emission wavelength due to PI contraction. The second was the self healing of the PTE structure when PI substrate was annealed at 250° C. There was no deformation observed on the PTE structure up to 1% strain and surface cracks were observed on the $SiO_2$ layer up to 3% strain. Remarkable self-healing of the PTE enabled nearly complete recovery from surface deformation when the strain level was lower than 3%. Finally, 1% red shift was observed in the emission spectra when the strain level was higher than 1%. This is an important advance and shows the ability to make one device which can be tuned to the desired IR emission wavelength.

REFERENCE LIST FOR EXAMPLE 2

[1] M. W. Tsai, T. H. Chuang, C. Y. Meng, Y. T. Chang, and S. C. Lee, Applied Physics Letters 89 (17) (2006).
[2] S. Tay, A. Kropachev, I. E. Araci, T. Skotheim, R. A. Norwood, and N. Peyghambarian, Applied Physics Letters 94 (7) (2009).
[3] Y. H. Ye, Y. W. Jiang, M. W. Tsai, Y. T. Chang, C. Y. Chen, D. C. Tzuang, Y. T. Wu, and S. C. Lee, Applied Physics Letters 93 (26) (2008).
[4] M. U. Pralle, N. Moelders, M. P. McNeal, I. Puscasu, A. C. Greenwald, J. T. Daly, E. A. Johnson, T. George, D. S. Choi, I. El-Kady, and R. Biswas, Applied Physics Letters 81 (25), 4685 (2002).
[5] C. M. Wang, Y. C. Chang, M. W. Tsai, Y. H. Ye, C. Y. Chen, Y. W. Jiang, Y. T. Chang, S. C. Lee, and D. P. Tsai, Optics Express 15 (22), 14673 (2007).
[6] Y. T. Chang, Y. T. Wu, J. H. Lee, H. H. Chen, C. Y. Hsueh, H. F. Huang, Y. W. Jiang, P. E. Chang, and S. C. Lee, Applied Physics Letters 95 (21) (2009).
[7] Data obtained from Intex Inc. are also available at http://www.eoc-inc.com/infrared_ir_pulsable_sources.htm.
[8] H. J. Park, J. W. Park, S. Y. Jeong, and C. S. Ha, Proceedings of the Ieee 93 (8), 1447 (2005).
[9] Data obtained from Dupont are also available at http://www2.dupont.com/Kapton/en_US/assets/downloads/pdf/summaryofprop.pdf.
[10] M. J. Cordill, A. Taylor, J. Schalko, and G. Dehm, Metallurgical and Materials Transactions a-Physical Metallurgy and Materials Science 41A (4), 870 (2010); Y. Leterrier, A. Pinyol, D. Gillieron, J. A. E. Manson, P. H. M. Timmermans, P. C. P. Bouten, and F. Templier, Engineering Fracture Mechanics 77 (4), 660 (2010); N. S. Lu, Z. G. Suo, and J. J. Vlassak, Acta Materialia 58 (5), 1679 (2010); M. Pecht, X. Wu, K. W. Paik, and S. N. Bhandarkar, Ieee Transactions on Components Packaging and Manufacturing Technology Part B-Advanced Packaging 18 (1), 150 (1995).

[11] Data obtained from Minco are also available at http://www.minco.com/uploadedFiles/Products/Thermofoil_Heaters/All-Polymide/hs202h-hap.pdf.

N. S. Lu, X. Wang, Z. G. Suo, and J. Vlassak, Journal of Materials Research 24 (2), 379 (2009).

K. J. Kim, J. K. Seo, and M. C. Oh, Optics Express 16 (3), 1423 (2008).

REFERENCES

Lin, Applied Physics Letters 87, 173116 (2005); Williams, Nature Photonics 2, 175 (2008); US application 2007/0165295; Matsui, Nature 446, 517 (2007); US application 2007/0269178; US 2011/0042589; WO2009/009181; U.S. Pat. No. 7,498,574; M. U. Pralle, N. Moelders, M. P. McNeal, I. Puscasu, A. C. Greenwald, J. T. Daly, E. A. Johnson, T. George, D. S. Choi, I. El-Kady, R. Biswas. *Photonic crystal enhanced narrow-band infrared emitters*, Applied Physics Letters (2002) v 81 n 25 p 4685; Ming-Wei Tsai, Tzu-Hung Chuang, Chau-Yu Meng, Yi-Tsung Chang, Si-Chen Lee. *High performance midinfrared narrow-band plasmonic thermal emitter*, Applied Physics Letters (2006) v 89 p 173116; Sungwon Kim, Venkatraman Gopalan. *Strain-tunable photonic band gap crystals*, Applied Physics Letters (2002) v 78 n 20 p 3015; Kyung-Jo Kim, Jun-Kyu Seo, Min-Cheol Oh. *Strain induced tunable wavelength filters based on flexible polymer waveguide Bragg reflector*, Optics Express (2008) v 16 n 3 p 1423; W. Park, E. Schonbrun, M. Tinker, J.-B. Lee. *Tunable nanophotonic devices based on flexible photonic crystal*, Proceedings of the SPIE (2004) v 5511 p 165; V. K. Dmitriev, V. N. Inkin, G. G. Kirpilenko, B. G. Potapov, E. A. Ilyichev, E. Y. Shelukhin. *Thermostable resistors based on diamond-like carbon films deposited by CVD method*, Diamond and Related Materials (2001) v 10 p 1007; Vasiliev A A, Pavelko R G, Gogish-Klushin S Y, et al. *Alumina MEMS platform for impulse semiconductor and IR optic gas sensors*, Sensors and Actuators B: Chemical (2008) v 132 n 1 p 216; Hsu Y C, Chung D D L. *Silver particle carbon-matrix composites as thick films for electrical applications*, Journal of Electronic Materials (2007) v 36 n 9 p 1188.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a structure is claimed, it should be understood that structures known in the prior art, including certain structures disclosed in the references disclosed herein (particularly in referenced patent documents), are not intended to be included in the claim.

When a group of substituents is disclosed herein, it is understood that all individual members of those groups and all subgroups of the group members, and classes of group members that can be formed using the substituents are disclosed separately. When a Markush group or other grouping is used herein, all individual members of the group and all combinations and subcombinations possible of the group are intended to be individually included in the disclosure.

Every formulation or combination of components described or exemplified can be used to practice the invention, unless otherwise stated. Specific names of compounds and other materials are intended to be exemplary, as it is known that one of ordinary skill in the art can name the same compounds and materials differently. One of ordinary skill in the art will appreciate that methods, device elements, starting materials, synthetic methods, and analysis methods other than those specifically exemplified can be employed in the practice of the invention without resort to undue experimentation. All art-known functional equivalents, of any such methods, device elements, starting materials, synthetic methods, and analysis methods are intended to be included in this invention. Whenever a range is given in the specification, for example, a thickness range, a distance range, a diameter range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a structure or in a description of elements of a device, is understood to encompass those structures and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

In general the terms and phrases used herein have their art-recognized meaning, which can be found by reference to standard texts, journal references and contexts known to those skilled in the art. The definitions are provided to clarify their specific use in the context of the invention.

We claim:

1. A method of tuning the emission wavelength from a tunable infrared plasmonic emitting structure, comprising:
 providing a structure comprising:
 (a) a perforated or patterned first conductive layer having a plurality of relief features provided in a periodic spatial configuration, wherein the relief features are separated from each other by adjacent recessed features, wherein the distance between features is between 1-15 μm;
(b) a dielectric layer underlying the first conductive layer;
(c) a second conductive layer underlying the dielectric film; and
(d) a substrate underlying the second conductive layer;
tuning the emission wavelength by one or more of applying a force in a biaxial direction parallel to the substrate, changing the distance between relief features, or changing the resistivity and dielectric constant of the dielectric layer.

2. The method of claim 1, wherein the substrate is flexible and the tuning step is performed by applying a force in a biaxial direction parallel to the substrate.

3. The method of claim 1, wherein the dielectric layer is a nanoamorphous carbon layer comprising a total of from 0 to 60 atomic percent of one or more dopants of the dopant group consisting of: transition metals, lanthanoids, electro-conductive carbides, silicides and nitrides.

4. The method of claim 3, wherein the nanoamorphous carbon layer comprises a $MoSi_2$ dopant.

5. A tunable infrared plasmonic emitting structure comprising:
(a) a perforated or patterned first conductive layer having a plurality of relief features provided in a periodic spatial configuration, wherein the relief features are separated from each other by adjacent recessed features;
(b) a dielectric layer underlying the first conductive layer;
(c) a second conductive layer underlying the dielectric film; and
(d) a flexible substrate underlying the second conductive layer.

6. The structure of claim 5, wherein the distance between relief features is from 1-15 micrometers.

7. The structure of claim 5, wherein the first and second conductive layers are independently selected from the group consisting of: aluminum, silver, gold, nanoamorphous carbon doped with metal, platinum, copper, iron, iridium, tungsten, molybdenum, nickel, cobalt, zinc, lead, vanadium, chromium, titanium, conducting carbides, silicides and nitrides.

8. The structure of claim 5, wherein the dielectric layer comprises a dielectric material selected from silicon dioxide, silicon nitride, silicon oxynitride, alumnimum oxide, aluminum nitride, polymer, $Ta_2O_5$, or nanoamorphous carbon.

9. The structure of claim 5, wherein the dielectric layer comprises: $SiO_2$, $Al_2O_3$, $Ta_2O_5$, or nanoamorphous carbon.

10. The structure of claim 5, wherein the flexible substrate is a high temperature stable polymer.

11. The structure of claim 5, wherein the high temperature stable polymer is polyimide.

12. A method of reversibly tuning the light emission from a tunable radiation emitting structure of claim 5, comprising increasing or decreasing the distance between the relief features by applying a mechanical force in the plane of the flexible substrate.

13. The method of claim 12, wherein the force is applied in symmetric biaxial directions.

14. The method of claim 12, wherein the mechanical force increases the distance between relief features by 1-25%.

15. The method of claim 12, wherein the light emission is in the range of 2-15 μm.

16. A method of light emission, comprising:
applying electrical energy to a structure of claim 5, wherein the applying electrical energy heats the structure.

17. A tunable infrared plasmonic radiation emitting structure comprising:
(a) a perforated or patterned first conductive layer having a plurality of relief features provided in a periodic spatial configuration, wherein the relief features are separated from each other by adjacent recessed features, wherein the relief features are spaced between 1-15 μm apart;
(b) a dielectric layer comprising nanoamorphous carbon underlying the first conductive layer;
(c) a second conductive layer underlying the dielectric film; and
(d) a substrate underlying the second conductive layer.

18. The structure of claim 17, wherein the first and second conductive layers are independently silver or gold.

19. The structure of claim 17, wherein the substrate is silicon or glass.

20. The structure of claim 17, wherein the dielectric layer comprises nanoamorphous carbon and a total of from 0 to 60 atomic percent of one or more dopants of the dopant group consisting of: transition metals, lanthanoids, electro-conductive carbides, silicides and nitrides.

21. The structure of claim 17, wherein the nanoamorphous carbon layer comprises a $MoSi_2$ dopant.

22. A method of light emission, comprising:
applying electrical energy to a structure of claim 17 to heat the structure.

* * * * *